(12) United States Patent
Ogura

(10) Patent No.: US 7,605,443 B2
(45) Date of Patent: Oct. 20, 2009

(54) SEMICONDUCTOR SUBSTRATE MANUFACTURING METHOD AND SEMICONDUCTOR DEVICE MANUFACTURING METHOD, AND SEMICONDUCTOR SUBSTRATE AND SEMICONDUCTOR DEVICE MANUFACTURED BY THE METHODS

(75) Inventor: Atsushi Ogura, Tokyo (JP)

(73) Assignee: NEC Corporation, Tokyo (JP)

( * ) Notice: Subject to any disclaimer, the term of this patent is extended or adjusted under 35 U.S.C. 154(b) by 535 days.

(21) Appl. No.: 10/513,507

(22) PCT Filed: May 8, 2003

(86) PCT No.: PCT/JP03/05783

§ 371 (c)(1),
(2), (4) Date: Nov. 5, 2004

(87) PCT Pub. No.: WO03/096426

PCT Pub. Date: Nov. 20, 2003

(65) Prior Publication Data

US 2005/0176222 A1 Aug. 11, 2005

(30) Foreign Application Priority Data

May 8, 2002 (JP) ............................. 2002-133090

(51) Int. Cl.
*H01L 21/764* (2006.01)
*H01L 21/265* (2006.01)
*H01L 27/12* (2006.01)

(52) U.S. Cl. .............................. 257/522; 257/E21.564; 438/422; 438/151; 438/162

(58) Field of Classification Search ................ 438/528, 438/407, 422, 411, 151, 162; 257/522, E21.564; 428/446
See application file for complete search history.

(56) References Cited

U.S. PATENT DOCUMENTS

| 4,925,805 | A | * | 5/1990 | van Ommen et al. | ........ 438/407 |
| 5,204,282 | A | * | 4/1993 | Tsuruta et al. | ............. 438/406 |
| 5,714,395 | A | * | 2/1998 | Bruel | ......................... 438/528 |
| 5,900,652 | A | * | 5/1999 | Battaglia et al. | ............ 257/135 |
| 5,985,688 | A | * | 11/1999 | Bruel | .......................... 438/53 |

(Continued)

FOREIGN PATENT DOCUMENTS

JP    61-128542    6/1986

(Continued)

OTHER PUBLICATIONS

Notification of Transmittal of Copies of Translation of the International Preliminary Examination Report dated Jan. 27, 2005.

(Continued)

*Primary Examiner*—M. Wilczewski
(74) *Attorney, Agent, or Firm*—McGinn IP Law Group, PLLC

(57) ABSTRACT

The present invention relates to a method of manufacturing a semiconductor substrate, which enables a semiconductor device to have high speed operating characteristics and high performance characteristics such as lower electrical power consumption, and a method of manufacturing a semiconductor device including a method of manufacturing the semiconductor substrate thereof in a process, as well as to a semiconductor substrate manufactured by the method of manufacturing the same and a semiconductor device manufactured using the semiconductor substrate.

103 Claims, 24 Drawing Sheets

U.S. PATENT DOCUMENTS

| | | | |
|---|---|---|---|
| 6,303,468 B1* | 10/2001 | Aspar et al. | 438/455 |
| 6,316,333 B1* | 11/2001 | Bruel et al. | 438/458 |
| 6,383,924 B1 | 5/2002 | Farrar et al. | |
| 6,429,104 B1* | 8/2002 | Auberton-Herve | 438/527 |
| 6,551,944 B1* | 4/2003 | Fallica et al. | 438/719 |
| 6,790,751 B2* | 9/2004 | Tsuruta et al. | 438/524 |
| 6,809,044 B1* | 10/2004 | Aspar et al. | 438/120 |
| 6,828,632 B2* | 12/2004 | Bhattacharyya | 257/347 |
| 6,929,984 B2* | 8/2005 | Forbes et al. | 438/143 |
| 6,974,759 B2* | 12/2005 | Moriceau et al. | 438/459 |
| 7,033,868 B2* | 4/2006 | Nakamura et al. | 438/149 |
| 7,052,948 B2* | 5/2006 | Murphy et al. | 438/219 |
| 7,193,256 B2* | 3/2007 | Renna et al. | 257/288 |
| 2002/0022337 A1* | 2/2002 | Maleville et al. | 438/406 |
| 2002/0094668 A1* | 7/2002 | Aspar et al. | 438/526 |
| 2003/0077885 A1* | 4/2003 | Aspar et al. | 438/517 |
| 2003/0168711 A1* | 9/2003 | Villa et al. | 257/506 |
| 2003/0190766 A1* | 10/2003 | Gonzalez et al. | 438/57 |
| 2004/0014299 A1* | 1/2004 | Moriceau et al. | 438/459 |
| 2004/0014304 A1* | 1/2004 | Bhattacharyya | 438/570 |
| 2004/0058555 A1* | 3/2004 | Moriceau et al. | 438/736 |
| 2004/0124439 A1* | 7/2004 | Minami et al. | 257/200 |
| 2004/0152272 A1* | 8/2004 | Fladre et al. | 438/284 |
| 2004/0248349 A1* | 12/2004 | Renna et al. | 438/197 |
| 2005/0017273 A1* | 1/2005 | Forbes et al. | 257/288 |
| 2005/0023578 A1* | 2/2005 | Bhattacharyya | 257/288 |
| 2005/0023613 A1* | 2/2005 | Bhattacharyya | 257/348 |
| 2005/0029683 A1* | 2/2005 | Forbes et al. | 257/913 |
| 2005/0176222 A1* | 8/2005 | Ogura | 438/514 |
| 2005/0250274 A1* | 11/2005 | Forbes et al. | 438/199 |
| 2006/0006442 A1* | 1/2006 | Gonzalez et al. | 257/296 |
| 2006/0019476 A1* | 1/2006 | Lagahe et al. | 438/514 |
| 2006/0079071 A1* | 4/2006 | Moriceau et al. | 438/459 |
| 2006/0138541 A1* | 6/2006 | Nakamura et al. | 257/347 |
| 2007/0042558 A1* | 2/2007 | Villa et al. | 438/311 |
| 2007/0138512 A1* | 6/2007 | Kanemoto | 257/211 |
| 2007/0181920 A1* | 8/2007 | Renna et al. | 257/288 |

FOREIGN PATENT DOCUMENTS

| | | | |
|---|---|---|---|
| JP | 63-278375 | | 11/1988 |
| JP | 4-304653 | | 10/1992 |
| JP | 7-169830 | | 7/1995 |
| JP | 11-233449 | * | 8/1999 |
| JP | 11-260751 | | 9/1999 |
| JP | 2000-22158 | | 1/2000 |
| JP | 2000-294754 | * | 10/2000 |
| JP | 2001-144276 | | 5/2001 |
| JP | 2001-252555 | | 9/2001 |
| WO | WO 87/04860 | | 8/1987 |

OTHER PUBLICATIONS

Atsushi Ogura, "Formation of Buried Oxide Layer in Si Substrates by Oxygen Precipitation at Implantation Damage of Light Ions", Jpn. J. Appl. Phys., vol. 40, Part 2, No. 10B, Oct. 15, 2001, pp. L1075-L1077.

Chinese Office action dated Nov. 17, 2006, with partial English translation.

Japanese Office Action dated Jul. 31, 2007 with partial English-translation.

* cited by examiner

SEMICONDUCTOR SUBSTRATE MANUFACTURING METHOD AND SEMICONDUCTOR DEVICE MANUFACTURING METHOD, AND SEMICONDUCTOR SUBSTRATE AND SEMICONDUCTOR DEVICE MANUFACTURED BY THE METHODS

TECHNICAL FIELD

The present invention relates to a method of manufacturing a semiconductor substrate, which enables a semiconductor device to have high speed operating characteristics and high performance characteristics such as lower electrical power consumption, and a method of manufacturing a semiconductor device including a method of manufacturing the semiconductor substrate thereof in a process, as well as to a semiconductor substrate manufactured by the method of manufacturing the same and a semiconductor device manufactured using the semiconductor substrate.

For the purpose of more fully describing a technology level related to the present invention at the present moment, all of the patents, patent applications, patent gazettes, scientific literature, and the like cited or specified in the present application are referred, and all description thereof is incorporated herein.

BACKGROUND OF THE ART

The present invention relates to a method of manufacturing a semiconductor substrate, which enables a semiconductor device to have high speed operating characteristics and high performance characteristics such as lower electrical power consumption, and a method of manufacturing a semiconductor device including a method of manufacturing the semiconductor substrate thereof in a process, as well as to a semiconductor substrate manufactured by the method of manufacturing the same and a semiconductor device manufactured using the semiconductor substrate.

For the purpose of more fully describing a technology level related to the present invention at the present moment, all of the patents, patent applications, patent gazettes, scientific literature, and the like cited or specified in the present application are referred, and all description thereof is incorporated herein.

BACKGROUND ART

Currently, in order to reduce leakage current in an MOS transistor, an SON substrate (Silicon-On-Nothing) in which a cavity is embedded in a predetermined region in an Si substrate is being developed.

One example of a method of manufacturing this SON substrate is disclosed in Japanese Unexamined Patent Publication No. 2001-144276. FIG. 1A to FIG. 1D are partial longitudinal sectional views of the SON substrate in each process according to a first conventional method of manufacturing the SON substrate. Lithography technology using a hard mask and anisotropic etching technology are used in combination to form a trench having a high aspect ratio in the Si substrate, and then high-temperature heat treatment is further carried out in 100% hydrogen atmosphere.

More specifically, as shown in FIG. 1A, a mask material 121 is formed on a silicon substrate 124, and a resist pattern 122 is further formed on the mask material 121.

As shown in FIG. 1B, the mask material 121 is patterned by the anisotropic etching making the resist pattern as a mask, and a pattern of the resist pattern 122 is transcribed to the mask material 121. After separation of the resist pattern 122, the mask material 121 is used as a mask to pattern the silicon substrate 124 with the anisotropic etching to form a plurality of trenches 120 disposed two-dimensionally on an upper portion region of the substrate 124.

As shown in FIG. 1C and FIG. 1D, high-temperature heat treatment is carried out in the 100% hydrogen atmosphere, before removing the mask material 121. This causes an opening of each trench 120 to be closed and a plurality of micro-cavities 126 to be formed in the silicon substrate 124. The plurality of the micro-cavities 126 are further combined with each other to form one flat-shaped cavity 125 in the silicon substrate 124.

Another example of the method of manufacturing the SON substrate is disclosed in IEEE Transaction on Electron Devices 47$^{th}$ Vol. (No. 11) on pp. 2179 to 2184 (November issue in 2000). FIG. 2A to FIG. 2C are partial longitudinal sectional views of the SON substrate in each process according to a second conventional method of manufacturing the SON substrate. An SiGe film and an Si film are sequentially formed on the Si substrate in epitaxial growth, an etching hole is formed in the Si film, and then the SiGe film is selectively removed by etching through the hole to form a cavity under the Si film.

More specifically, as shown in FIG. 2A, an SiGe film 130 is formed on a silicon substrate 132 in the epitaxial growth, and an Si film 131 is further formed on the SiGe film 130 in the epitaxial growth.

As shown in FIG. 2B, an etching hole 133 is formed in the Si film 131.

As shown in FIG. 2C, the SiGe film 130 is selectively removed by etching through the hole 133 in the Si film 131 to form a cavity under the Si film.

Meantime, aside from the aforementioned SON semiconductor substrate, a substrate in which an insulting layer comprising partially oxide (largely silicon dioxide) is formed in an Si substrate, so-called, "SOI (Silicon-On-Insulator) substrate" is already being developed.

The easiest conventional method to manufacture the SOI substrate involves application of an SIMOX process (Separation-By-Implanted-Oxygen). This method is a method by which an SOI structure is partially formed in a predetermined region of a silicon substrate by using a mask such as $SiO_2$ mask to selectively implant $O^+$ ions only into the predetermined region of the silicon substrate and giving high-temperature heat treatment in the same way as a normal SIMOX process.

However, the aforementioned first conventional manufacturing method shown in FIG. 1A to FIG. 1D gives rise to the following problems.

First, in order to form a plurality of the trenches 120, the film 121 which grows into an etching mask (ex. $SiO_2$ film) is laminated, then the resist 122 is coated, and the resist 122 is processed by exposure, followed by processing of the mask 121. Furthermore, a photo-resist 123 is removed, and then a plurality of the deep trenches 120 are formed in the Si substrate using the mask 121. Subsequently, the mask 121 is removed, and then heat treatment is carried out at a high temperature to form one flat-shaped cavity 125. Thus, the process is greatly complicated.

Second, the respective trenches 120 have a very high aspect ratio exceeding 5 of a normal aspect ratio, requiring a narrow opening and a very deep shape. Etching for formation of these deep trenches 120 having the high aspect ratio requires hard techniques.

Third, the etching for the formation of these deep trenches 120 having the high aspect ratio usually gives rise to a serious problem with contamination involved in an etching process, requiring to clean inside of the deep trenches. However, such cleaning necessitates very hard techniques, and, what is more, there is a possibility that complete contamination removal cannot usually be accomplished in spite of carrying out the cleaning.

Fourth, the heat treatment need be carried out in the hydrogen 100% atmosphere, besides, at a high temperature. Even the slightest mistake can cause explosion hazard.

Meantime, the aforementioned second conventional manufacturing method shown in FIG. 2A to FIG. 2C gives rise to the following problems.

First, it is necessary to form a two-layer structure comprising the SiGe film 130 and the Si film 131 in the epitaxial growth which is known as a complicated and high cost process on the substrate 132.

Second, the epitaxial growth produces a multilayered structure comprising a substance different in lattice constant, causing easier introduction of a crystal defect or distortion.

Third, a normal Si-LSI process contains Ge which is known to deteriorate device characteristics as a contaminated source, and the Ge remains in regions other than a region in which a cavity is formed at high concentration.

In this way, when the SON substrate is formed by use of conventional known technologies, a complex process is required, resulting in high cost, and further causing many problems such that contaminants remain and hence negatively affect device characteristics.

In addition, a method of manufacturing an SOI substrate which applies the conventional SIMOX gives rise to the following problems.

First, in a patter edge portion, peculiar forms such as elevation or hollows are noted in the Si film or $SiO_2$ film and concurrently many defects occur.

Second, a step is produced between a region in which a partial SOI structure is formed and a region in which the partial SOI structure is not formed on a surface of the obtained semiconductor substrate. Namely, no surface flatness is secured.

In this way, when the partial SOI substrate is formed by use of conventional known technologies, defects occur within the substrate, further making it difficult to secure the flatness of the semiconductor substrate surface.

DISCLOSURE OF THE INVENTION

Accordingly, a primary object of the present invention is to provide the method of manufacturing an SON semiconductor substrate free from the aforementioned problems.

A more specific object of the present invention is to provide a method of manufacturing a low-cost and high-quality SON semiconductor substrate.

Another object of the present invention is to provide a method of manufacturing a semiconductor device which includes a method of manufacturing an SON semiconductor substrate free from the aforementioned problems in a process thereof.

Still another object of the present invention is to provide a method of manufacturing a semiconductor device which includes a method of manufacturing a low-cost and high-quality SON semiconductor substrate.

Yet another object of the present invention is to provide an SON semiconductor substrate free from the aforementioned problems.

An additional object of the present invention is to provide a low-cost and high-quality SON semiconductor substrate.

A further object of the present invention is to provide a semiconductor device which includes an SON semiconductor substrate free from the aforementioned problems.

A still further object of the present invention is to provide a semiconductor device which includes a low-cost and high-quality SON semiconductor substrate.

A yet further object of the present invention is to provide a method of manufacturing a partial SOI semiconductor substrate free from the aforementioned problems.

Another object of the present invention is to provide a method of manufacturing a partial SOI semiconductor substrate with reduced defect density and high flatness.

A further object of the present invention is to provide a method of manufacturing a semiconductor device which includes a method of manufacturing a partial SOI semiconductor substrate free from the aforementioned problems in a process.

Still another object of the present invention is to provide a method of manufacturing a semiconductor device which includes a method of manufacturing a partial SOI semiconductor substrate with reduced defect density and high flatness in a process.

Yet another object of the present invention is to provide a partial SOI semiconductor substrate free from the aforementioned problems.

A still further object of the present invention is to provide a partial SOI semiconductor substrate with reduced defect density and high flatness.

A yet further object of the present invention is to provide a semiconductor device which includes a partial SOI semiconductor substrate free from the aforementioned problems.

An even yet further object of the present invention is to provide a semiconductor device which includes a partial SOI semiconductor substrate with reduced defect density and high flatness.

A first aspect of the present invention is a method of manufacturing a semiconductor substrate, comprising:

a first step of selectively implanting ions into a predetermined of a substrate, the implanted ions, in turn, forming a plurality of micro-cavities in said predetermined region; and a second step of giving heat treatment to the substrate to thereby allow growth of said plurality of respective micro-cavities, and further combination of adjacent micro-cavities with each other to form an insulating region comprising a cavity, cavity spread over said predetermined region.

According to the present invention, in said first step, ions are implanted into said predetermined region and the ions, in turn, form a plurality of micro-cavities in the predetermined region. The plurality of the micro-cavities are formed even when ion implantation is made at room temperature. More specifically, atoms in a substrate are desorbed by energy of ion implantation to form the micro-cavities. Here, when ions to be implanted are light ions, the adjacent ions collect together into gas.

In the first step, it is necessary to selectively implant the aforementioned ions into a region in which cavities should finally be formed, that is, into a predetermined region. It is a final object to manufacture a semiconductor device using the semiconductor substrate manufactured according to the method of the present invention. However, it is to be understood that the region in which the aforementioned cavities should be formed may be determined randomly in view of what characteristics a semiconductor device is given, and that the present invention does not particularly limit the region.

In said second step, the plurality of the respective micro-cavities are allowed to grow, and further to combine the adjacent micro-cavities with each other to form the insulating region comprising the cavity spread over the predetermined region. Said combined cavity formed by the heat treatment in said second step has a seamlessly uninterrupted inside surface, and said combined cavity has inner space completely closed from outside of said substrate by the inside surface. Namely, the inner space is not communicating with the outside of the substrate. In addition, a region over which a cavity spreads may be selected by selecting a region into which ions are implanted. More specifically, when the predetermined region is a flat-shaped region approximately parallel to a surface of the substrate, said cavity may also be made the flat-shaped cavity approximately parallel to the surface of the substrate.

It is preferable in view of keeping flatness of a substrate surface high that the heat treatment in said second step preferably allow softening of said substrate and include the heat treatment at a temperature high enough to allow the substrate surface to return to flatness even if the substrate surface corresponding to the region in which the cavity is formed in a moment when said cavity is formed within said substrate is elevated. Typically, the flatness of the substrate surface may be kept high by exposing the substrate to the heat treatment at a temperature of not less than 1000° C. A semiconductor device is formed in a region of the substrate positioned above said cavity. And, said cavity plays a role as the insulating region in the substrate, that is, as the embedded insulating region. Therefore, it is preferable that said substrate surface be flat throughout the region in which said cavity is formed and the region in which said cavity is not formed. More specifically, the facts that the flatness of the substrate surface is kept high, and that further an interface between an inside upper surface of said cavity, that is, an upper portion of said cavity and said substrate is approximately parallel and flat to a flat surface of said substrate, providing an easier manufacturing process of a semiconductor device using the substrate, for example, a lithography process, as well as making it possible for the semiconductor device manufactured using the substrate to perform desired high performance.

Accordingly, an SON substrate having the flat surface as well as having the approximately flat cavity may be manufactured by carrying out said first step and said second step.

In the methods of manufacturing conventional SON substrates, flatness of the substrates sometimes failed to be secured, or defects occurred between a cavity and a substrate surface because a substrate surface corresponding to a region in which a cavity was formed was elevated.

However, according to the present invention, the heat treatment in the second step typically includes the heat treatment at a high temperature of not less than 1000° C., so that the SON substrate may be manufactured while keeping the flatness of the substrate surface high. The reason is, as described above, that as a result of the substrate being softened by the high-temperature heat treatment, even if the substrate surface corresponding to the region in which the cavity is formed is elevated in a moment when the cavity is formed within the substrate, the substrate surface returns to flatness at once, namely, the once elevated portion being smoothed.

Accordingly, high flatness of the substrate surface may be realized, while the aforementioned second step allows growth of said plurality of the micro-cavities formed in the predetermined region in the aforementioned first step and further combination of the adjacent micro-cavities with each other to form an insulating region comprising the cavity spread over said predetermined region due to inclusion of at least the aforementioned high-temperature heat treatment over said predetermined region.

In addition, the aforementioned second step may further include low-temperature heat treatment carried out in a low-temperature region of not less than 400° C. through less than 700° C. in order to discharge said implanted ions outside of said substrate as gas before said high-temperature heat treatment carried out in a high-temperature range of not less than 1000° C. to allow the combination of the adjacent micro-cavities with each other to form the insulating region comprising the cavity, spread over said predetermined region.

In further addition, the aforementioned second step may further include middle-temperature heat treatment carried out in a middle-temperature region of not less than 700° C. through less than 1000° C. in order to allow growth of said plurality of the respective micro-cavities, before said high-temperature heat treatment carried out in a high-temperature range of not less than 1000° C. to allow the combination of the adjacent micro-cavities with each other to form the insulating region comprising the cavity, spread over said predetermined region.

In still addition, the aforementioned second step may further include the low-temperature heat treatment carried out in the low-temperature region of not less than 400° C. through less than 700° C. in order to discharge said implanted ions outside of said substrate as gas, the middle-temperature heat treatment carried out in the middle-temperature region of not less than 700° C. through less than 1000° C. to allow the growth of said plurality of the respective micro-cavities, and the high-temperature heat treatment carried out in the high-temperature range of not less than 1000° C. to allow the combination of the adjacent micro-cavities with each other to form the insulating region comprising the cavity, spread over said predetermined region.

In other words, the ions implanted in the first step are discharged outside of said substrate as gas by exposing said substrate to the low-temperature heat treatment in the low-temperature region of not less than 400° C. through less than 700° C. After that, the ions cause the growth of said plurality of the respective micro-cavities by exposing said substrate to the middle-temperature heat treatment in the middle-temperature region of not less than 700° C. through less than 1000° C. Further, the adjacent cavities are allowed to combine with each other to form the cavity spread over the predetermined region of said substrate, as well as to keep the flatness of the substrate surface, as described above by exposing said substrate to the high-temperature heat treatment in the high-temperature range of not less than 1000° C.

Furthermore, it is more preferable that said low-temperature heat treatment be carried out at a temperature of not less than 400° C. through less than 600° C. , said middle-temperature heat treatment be carried out at a temperature of not less than 800° C. through less than 1000° C. , and said high-temperature heat treatment be carried out at a temperature increased from 1200° C.

In said second step, at least the high-temperature heat treatment may be carried out in oxygen rich atmosphere. In this case, oxygen atoms are introduced into inner space of said cavity completely closed from said substrate surface through a substrate upper portion region, and the inside surface of said cavity is oxidized by the introduced oxygen to form an oxide film on the inside surface of said cavity. In addition to the aforementioned action effect, the oxide film may be formed on the inside surface of said cavity by carrying out the high-temperature heat treatment in the oxygen rich atmosphere. Insulation characteristics in the cavity is increased by forming the oxide film on the inner surface of the cavity, thereby providing further reduced and cut leakage current.

And, a film thickness of the oxide film may be formed on the inside surface of said cavity by adjusting oxygen content in the oxygen atmosphere, or oxygen concentration. In other words, the film thickness of the oxide film formed on the inside surface of the cavity may be increased by increasing the oxygen content in the oxygen atmosphere, or the oxygen concentration.

In addition, the film thickness of the oxide film of side walls in said cavity may be increased more than the film thickness of the oxide film formed on inside upper and lower faces of said cavity by adjusting conditions of the ion implantation and conditions of the high-temperature heat treatment in said oxygen atmosphere. In said high-temperature heat treatment, the oxygen atoms contained in the oxygen atmosphere include: ones which are introduced into said cavity from said substrate surface, and ones which are introduced within a range of a depth approximately identical with the range of the depth, from said substrate surface to inside of said substrate, at which said cavity is formed. More specifically, the conditions of said ion implantation and the conditions of the high-temperature heat treatment in said oxygen atmosphere are adjusted so that the depth at which the oxygen atoms contained in the oxygen atmosphere are introduced into the substrate is set within the range of the depth at which the cavity is formed, and preferably in the vicinity of a intermediate level in the range of the depth. This causes the oxygen introduced into the inner space of the cavity to oxidize the inside upper and lower faces of the cavity. In contrast with this, in addition to the oxygen introduced into the inner space of the cavity, the side walls of the cavity are oxidized even by oxygen introduced into the vicinity of the side walls of the cavity within the substrate, so that a thickness of the oxide film which is formed on the side walls of the cavity is increased more than the film thickness of the oxide film which is formed on the inside upper and lower faces of the cavity. And, a thick portion of the oxide film which is formed on the side walls of the cavity is thickest in the vicinity of the intermediate level in the range of the depth at which the cavity is formed.

As described above, said oxide film is preferably reduced in thickness in the inside upper and lower surfaces of said cavity approximately perpendicular to a thickness direction of said substrate, and is increased in thickness in the side walls whose inside surface of the cavity is approximately parallel to the thickness direction of the substrate. In this case, said oxide film is formed so as to be reduced in thickness in the upper and lower surfaces of said cavity, so that dielectric constant may be reduced more than that of the semiconductor substrate in which the oxide film is formed so as to be increased in thickness in the inside upper and lower surfaces of said cavity. In particular, in the inside upper surface of said cavity, the oxide film is preferably formed to be reduced in thickness to a degree to which a surface state is not formed. Moreover, as described above, said oxide film formed on the inside surface of said cavity is thick in a portion extending in a direction approximately parallel to the thickness direction of said substrate. This makes it possible to improve durability against mechanical strength and mechanical stress in the thickness direction of the semiconductor substrate, thus providing a shape of the cavity to be kept with high precision.

In addition, a plurality of said cavities may be formed in the substrate in the same depth range apart from each other at predetermined intervals. In this case, an insulating region in which a plurality of said cavities are separated with each other by the thick portion of the oxide film in the substrate may be formed by adjusting the conditions of said ion implantation and the conditions of the high-temperature heat treatment in said oxygen atmosphere. In this case, the thick portion of the film thickness of the oxide film which separates a plurality of said cavities with each other is equivalent to the aforementioned oxide film which is formed on the side walls of said cavities. Here, the thick portion of the oxide film which separates a plurality of said cavities with each other comprises barriers varying depending on a depth level of the film thickness. The film thickness is minimal at an intermediate depth level of said cavity, and the film thickness is gradually increased as closer to the depth level of the inside upper face and the depth level of the inside lower face of said cavity.

Further continuation of said high-temperature heat treatment allows deformation of said barrier portion, making it possible to render the film thickness of the barrier approximately uniform to depth level changes. In general, in the case where an SON substrate having a cavity within a substrate is manufactured, it becomes difficult to keep the shape of said cavity and the high flatness of the substrate surface positioned above the cavity, with increased size of the cavity in a horizontal direction parallel to the substrate surface. Namely, the mechanical strength and dividing of the substrate, and the mechanical strength in the thickness direction of the substrate are deteriorated. However, as described above, the cavity has at least one barrier comprising a part of said oxide film inside thereof, whereby the at least one barrier enhances the mechanical strength and dividing of the substrate, and the mechanical strength in the thickness direction of the substrate. Hence, presence or the at least one barrier facilitates to keep the shape of the cavity and the high flatness of the substrate surface positioned above the cavity, even if the size in a horizontal direction of said cavity is enlarged.

Moreover, the at least one barrier comprises oxides, so that the dielectric constant may be kept low.

In addition, an oxide film comprising a portion coating the inside surface of said cavity, and at least one columnar portion present in the cavity may be formed by allowing presence of at least one island-shaped region into which ions are not implanted, in said predetermined region, and adjusting the conditions of said ion implantation and the conditions of the high-temperature heat treatment in said oxygen atmosphere. In this case, the thick portion of the film thickness of the oxide film which separates a plurality of said cavities with each other is equivalent to the columnar portion of the oxide film which is formed in said cavities. Here, the columnar portion of the oxide film comprises barriers varying depending on size of its lateral direction, that is, a depth level of its diameter. The film thickness is minimal at the intermediate depth level of said cavity, and the diameter is gradually increased as closer to the depth level of the inside upper face and the depth level of the inside lower face of said cavity.

Further continuation of said high-temperature heat treatment allows deformation of the columnar portion of said oxide film, making it possible to be the column whose diameter is approximately uniform to depth level changes.

As described above, in general, in the case where an SON substrate having a cavity within a substrate is manufactured, it becomes difficult to keep the shape of the cavity and the high flatness of the substrate surface positioned above the cavity, with increased size in a horizontal direction parallel to the substrate face of the cavity. Namely, the mechanical strength and dividing of the substrate, and the mechanical strength in the thickness direction of the substrate are deteriorated. However, as described above, the cavity has at least one columnar portion comprising a part of said oxide film inside thereof, whereby the at least one columnar portion enhances the mechanical strength and dividing of the substrate, and the mechanical strength in the thickness direction of the substrate. Hence, presence of the at least one columnar portion facilitates to keep the shape of the cavity and the high flatness of the substrate surface positioned above the cavity, even if the size in the horizontal direction of said cavity is enlarged.

Moreover, the at least one columnar portion comprises oxides, so that the dielectric constant may be kept low.

Either the aforementioned substrate in which the oxide film is present in the cavity, or the aforementioned substrate in which the oxide film is not present in the cavity can be regarded as the SON substrate. However, the SOI substrate may be manufactured by the following methods. More specifically, the whole inner space of said cavity may be finally filled by further increasing the oxygen content in the oxygen atmosphere, or the oxygen concentration and increasing the film thickness in said cavity. In this way, when the whole inner space of said cavity is filled with the oxide film, the semiconductor substrate can be regarded as the SOI substrate. In this case, the method of manufacturing the aforementioned semiconductor substrate according to the present invention can be regarded as the method of manufacturing a partial SOI substrate.

In the case where the high-temperature heat treatment is carried out in the oxygen atmosphere, it is not necessary to render all the time for carrying out the high-temperature heat treatment oxygen atmosphere. The high-temperature heat treatment is carried out only during a certain period of time, and for the rest of the time, the high-temperature heat treatment may be carried out in inert gas atmosphere. Particularly, it is preferable to utilize oxygen rich atmosphere only during the last certain period of time of a period in which the high-temperature heat treatment is carried out. In this way, the reason for carrying out the high-temperature heat treatment in the oxygen atmosphere only during the last certain period of time of the high-temperature heat treatment is as follows. As described above, the high-temperature heat treatment is intended to cause further growth and combination of the micro-cavities formed in the substrate and to finally form the combined cavity 2 in the predetermined region. However, it is preferable to ensure prevention of forming the oxide film on the inside surfaces of the micro-cavities in the midst of the growth and combination of the micro-cavities. This is because that once the oxide film is formed on the inside surfaces of the micro-cavities, there is a possibility that the oxide film interferes with the subsequent further growth and combination of the micro-cavities.

Note that in the method of manufacturing a semiconductor substrate of the present invention, it is also possible to carry out all sub-steps included in the second step as well as the high-temperature heat treatment, that is, the low-temperature heat treatment or the middle-temperature heat treatment in the oxygen atmosphere. Here, if the low-temperature heat treatment or the middle-temperature heat treatment is carried out in the oxygen atmosphere, the inside surfaces of a plurality of the micro-cavities are oxidized, causing concern to interfere with the subsequent growth and combination of the micro-cavities. However, in these low-temperature heat treatment and middle-temperature heat treatment, the temperature is actually less high, so that the oxygen in the atmosphere is unlikely to enter into the substrate, with no oxidation of the inside surfaces of the micro-cavities in practice. Accordingly, the possibility to give negative effects on a process of the growth and combination of the micro-cavities is low.

In addition, when the high-temperature heat treatment is carried out in the oxygen atmosphere, not only is the inside surface of the cavity oxidized, but also the substrate surface is deservingly oxidized, resulting in formation of the oxide film on the substrate surface. As described above, a thickness of a region of the substrate which is oxidized surface may be adjusted by adjusting the oxygen content in the oxygen atmosphere, or the oxygen concentration, and eventually the film thickness of the oxide film formed on the substrate surface may be adjusted. And, the oxide film formed on the substrate surface by the high-temperature heat treatment in the oxygen atmosphere is subsequently removed, that is, scraped away. In the substrate surface after removal of the oxide film, the region above the cavity is usable as an active layer. In this case, distance from the substrate surface after removal of the oxide film to an upper portion of the cavity corresponds to a thickness of the active layer. Accordingly, the thickness of the active layer of the substrate may be adjusted by adjusting the film thickness of the oxide film formed on the substrate surface and the film thickness of the oxide film formed on the inside upper surface of said cavity. More specifically, the thickness of the active layer of the semiconductor substrate which is finally obtained after removing the oxide film will be reduced, if the oxygen content in the oxygen atmosphere, or the oxygen concentration is elevated, and the film thickness of the oxide film which is formed on the substrate surface is increased. The thickness of the active layer of the semiconductor substrate which is finally obtained after removing the oxide film will be increased, if the oxygen content in the oxygen atmosphere, or the oxygen concentration is lowered, and the film thickness of the oxide film which is formed on the substrate surface is reduced.

As described above, the combined cavity has the inner space completely closed from said substrate outside by the inside surface. Namely, the inner space is not communicating with said substrate outside. Accordingly, in order to avoid the heat treatment at an excessively high temperature and to realize formation of the insulating film in said cavity, the heat treatment is preferably carried out at a high temperature in the oxygen rich atmosphere to introduce the oxygen into the cavity. In order to carry out the heat treatment in other atoms, for example, nitrogen rich atmosphere to introduce the other atoms into the cavity, at least the heat treatment at a temperature higher than in the case of the oxygen is necessary. Accordingly, it is difficult to form the insulating films other than the oxide film on the inside surface of the cavity by the heat treatment as compared with the case of forming the aforementioned oxide film. In addition, the oxide film is preferable in order to improve an interface between the insulating film to be formed on the inside surface of said cavity and said substrate. This is particularly preferable when said substrate is a substrate comprising silicon.

However, it is also possible that the insulating film which is formed on the inside surface of said cavity is made a multi-layer structure including the oxide film. In this case, it is possible that after forming the oxide film on the inside surface of the cavity by the aforementioned method, at least one communication hole for allowing communication between said cavity and said substrate outside is formed, at least one other insulating film is further formed on the oxide film coating the inside surface of the cavity through the communication hole, and a multilayer insulating structure coating the inside surface of the cavity is formed, as required. Subsequently, some known technique or known process is utilized to completely close the at least one communication hole. In this case, insulating materials which constitute the insulating films other than the oxide film include all materials exhibiting insulation characteristics. However, when said substrate is silicon, said oxide film is preferably oxide silicon, and typical examples of other insulating films include alumina, aluminum nitride, hafnium oxide, zirconium oxide, hafnium oxide silicon, and the like, but are not limited to these by any means.

Additionally, even if the oxide film is not formed on the inside surface of the cavity by said high-temperature heat treatment, it is possible that after forming the cavity by the aforementioned method, at least one communication hole for allowing the communication between said cavity and said substrate outside is formed and at least one insulating film is formed on the inside surface of the cavity through the communication hole, as required. Subsequently, some known technique or known process is utilized to completely close the at least one communication hole.

The ions implanted in the aforementioned first step are preferably at least one ion selected from the group consisting of hydrogen ion, helium ion, neon ion, and fluorine ion.

By using such, so-called, "light ions" to carry out the ion implantation, damage giving to the substrate can be minimized. Consequently, in the first step, it is not necessary to carry out substrate heat treatment, thus making it possible to carry out the ion implantation at room temperature. In addition, these ions are comparatively light elements, so that range distance, that is, the depth at which ions are implanted may be easily controlled. As a result, it is easier to accurately implant the ions into the predetermined region in the substrate.

In carrying out said ion implantation, it is also possible that a mask exclusively for ion implantation is prepared, the mask being used to selectively implant ions only into the predetermined region of the substrate. However, in this case, it is necessary that a mask exclusively for ion implantation with a highly accurate pattern to meet the predetermined region of the substrate be created and the mask be accurately positioned on said substrate.

Then, in the case where the semiconductor substrate manufactured based on said substrate is the semiconductor substrate as represented by the Field Effect Transistor with a control electrode represented by, for example, a gate electrode, it is possible to selectively implant ions into a region which self-aligns to the electrode without using the mask exclusively for the ion implantation. In this case, before the ion implantation in the first step is carried out, at least one electrode, for example, a control electrode represented by the gate electrode, is formed on said substrate, and then the ion implantation is carried out making the gate electrode as the mask in said first step. Namely, the electrode is already formed on the substrate prior to a process of implanting the ions, so that the electrode on the substrate plays a role of the mask in implanting the ions. And, the ions are not implanted into the region directly under the electrode, and are implanted into at least the region except for the region directly under the electrode. As a result, even if said substrate is exposed to the heat treatment in the subsequent second step, the cavity is not formed in the region directly under said electrode, and the cavity is formed around the region directly under the electrode. Namely, the cavity is formed in the region which self-aligns to the electrode.

And, it is that the substrate having the cavity formed in the region which self-aligns to the electrode is used to form a source region and a drain region which self-align to the electrode by a known method of manufacturing a semiconductor substrate to manufacture a semiconductor device. A cavity is not present in the region directly under the electrode, whereas a cavity is present directly under the source region and the drain region which are formed around the gate electrode.

Herewith, lower portions of the source region and the drain region abut on the upper portion of the cavity, thereby providing reduction of leakage current from the source region and the drain region to the substrate. At the same time, parasitic capacitance caused by p-n junction between the source and drain regions and said substrate is reduced, providing enhanced high-speed operating characteristics of the semiconductor device. More specifically, it is possible to form the cavity which abuts on the lower portions of the source region and the drain region, and which self-aligns to the electrode with creating the mask exclusively for the ion implantation and without accurately positioning the mask on the substrate.

In addition, in the case where the semiconductor device manufactured based on said substrate, is the semiconductor device having at least one isolation region, such as isolation represented by Shallow Trench Isolation on the substrate upper portion region, the ions may be selectively implanted into a region which self-aligns to the isolation region without having to use the mask exclusively for the ion implantation. In this case, before carrying out the ion implantation in said first step, at least one isolation region, such as the isolation represented by the Shallow Trench Isolation is formed on said substrate and then the ions are implanted making the isolation region as the mask in the first step. In other words, the isolation region is already formed on the substrate prior to a process of implanting the ions, so that the isolation region on the substrate plays a role of the mask in implanting the ions. And, the ions are not implanted into the isolation region and a region directly under the isolation region, and the ions are implanted into at least a region except for both the isolation region and the region directly under the isolation region. As a result, even if said substrate is exposed to the heat treatment in the subsequent second step, cavity is not formed in the isolation region and the region directly under the isolation region, and the cavity is formed in the region defined in the isolation region. Namely, the cavity is formed in the region which self-aligns to the isolation region.

When the ions are light ions in the first step, said ion implantation may be made at room temperature due to less damage to the substrate. Additionally, in the first step, said ion implantation may be carried out at a temperature higher than room temperature to recover the damage to the substrate caused by said ion implantation.

Furthermore, said predetermined region extends over a single semiconductor device element forming region of said substrate, whereby the insulating region comprising said combined cavity may be provided for each of said semiconductor device forming region. Alternatively, said predetermined region extends over a single circuit block forming region of said substrate, whereby the insulating region comprising said combined cavity may be provided for each of said circuit block forming region.

The substrate may be any substrate enabling formation of a semiconductor device, enabling formation of a plurality of micro-cavities by implanting ions into a predetermined region of the substrate in the first step, further enabling growth of the plurality of the respective cavities and further combination of the adjacent micro-cavities with each other in the second step, and finally enabling formation of a combined cavity present all over said predetermined region, but is not particularly limited. A typical example of the substrate includes a silicon substrate, semiconductor substrates other than silicon, an oxide substrate, a nitride substrate, and an oxide nitride substrate, but is not limited to these. Among these, the silicon substrate is particularly preferable. When said substrate is the silicon substrate, the oxide film which is formed in said cavity is preferably an oxide silicon film.

As has been described hereinbefore, in accordance with the method of manufacturing a semiconductor device according to the present invention, so-called, "SON substrate" having a cavity in a predetermined region, or so-called, "partial SOI substrate" in which said cavity is filled with an oxide film is provided, and reduction of leakage current in the state-of-the-art semiconductor device such as semiconductor Ultra Large-Scale Integration including an MOS transistor formed on the substrate can be realized, thereby providing further enhancement in an integration degree of the state-of-the-art semiconductor device such as the semiconductor Ultra Large-Scale Integration.

Furthermore, although a second aspect of the present invention will be described hereinafter, the foregoing description in relation to the method of manufacturing a semiconductor substrate as the first aspect of the present invention will be applied to the following description of the present second aspect, so that double description will be avoided in practice. More specifically, the second aspect of the present invention is the method of manufacturing a semiconductor substrate, comprising:

a first step of selectively implanting ions into a predetermined region in a substrate, the implanted ions, in turn, forming a plurality of micro-cavities in said predetermined region; and a second step of giving heat treatment to the substrate, thereby allowing growth of said plurality of the respective micro-cavities and further combination of the adjacent micro-cavities with each other to form an embedded insulating region comprising a combined cavity present all over said predetermined region, wherein said combined cavity has a seamlessly uninterrupted inside surface, as well as has inner space completely closed from outside of said substrate by the inside surface;

wherein the heat treatment in said second step includes high-temperature heat treatment, the high-temperature heat treatment allowing combination of the adjacent micro-cavities with each other to form said combined cavity present all over said predetermined region; and wherein an oxide film at least coating said inside surface of said cavity is formed by carrying out said high-temperature heat treatment in oxygen rich atmosphere, during at least the last certain period of time of said high-temperature heat treatment.

The heat treatment in said second step allows said substrate to be softened due to inclusion of high-temperature heat treatment carried out in a high temperature range of not less than 1000° C., and even if a surface of a substrate corresponding to a region in which said cavity is formed is elevated, in a moment when said cavity is formed within said substrate, allows the surface of the substrate to be returned to flatness at once, so that the surface of said substrate which is finally obtained is flat, and an interface between an upper portion of said cavity and said substrate is preferably parallel and flat to a flat surface of said substrate.

Said high-temperature heat treatment may be carried out in the high temperature range of not less than 1000° C.

Said second step may further include low-temperature heat treatment carried out in a low-temperature region of not less than 400° C. through less than 700° C. in order to discharge said implanted ions outside of said substrate as gas before said high-temperature heat treatment.

Said second step may further include middle-temperature heat treatment carried out in a middle-temperature region of not less than 700° C. through less than 1000° C. in order to allow growth of said plurality of the respective micro-cavities before said high-temperature heat treatment.

Said second step may further include the low-temperature heat treatment carried out in the low-temperature region of not less than 400° C. through less than 700° C. in order to discharge said implanted ions outside of said substrate as gas, and the middle-temperature heat treatment carried out in the middle-temperature region of not less than 700° C. through less than 1000° C. to allow the growth of said plurality of the respective micro-cavities, before said high-temperature heat treatment.

Said low-temperature heat treatment may be carried out at a temperature of not less than 400° C. through less than 600° C., said middle-temperature heat treatment may be carried out at a temperature of not less than 800° C. through less than 1000° C., and said high-temperature heat treatment may be carried out at a temperature increased further from 1200° C.

Said oxide film preferably has a thicker film thickness in a portion, which is formed on side walls of said cavity than in a portion, which is formed on inside upper and lower surfaces of said cavity.

Said oxide film may not only coat the inside surface of said cavity, but also include at least one columnar portion which is formed in inner space of said cavity.

Said oxide film may not only coat the inside surface of said cavity, but also include at least one barrier-structure portion which is formed in the inner space of said cavity.

Said high-temperature heat treatment may be carried out in said oxygen rich atmosphere until said oxide film fills up the inner space of said cavity.

The oxygen rich atmosphere may be utilized only during the last certain period of time of a period in which said high-temperature heat treatment is carried out.

It is possible to further include a process of removing a surface oxide film formed on a surface of said substrate by said high-temperature heat treatment carried out in said oxygen rich atmosphere after said high-temperature heat treatment.

Said ions may be at least one ion selected from the group consisting of hydrogen ion, helium ion, neon ion, and fluorine ion. In said first step, said ion implantation may be carried out at room temperature. In said first step, said ion implantation may be carried out at a temperature higher than room temperature.

In said first step, a mask exclusively for ion implantation may be used to selectively implant said ions only into the predetermined region of said substrate.

In said first step, at least one electrode is formed on said substrate, and said at least one electrode is used as a mask to selectively implant said ions only into the predetermined region of said substrate, whereby in said second step, said cavity self-aligning to said at least one electrode may be formed.

In said first step, at least one isolation region is formed in the upper portion region of said substrate, and said at least one isolation region is used as the mask to selectively implant said ions only into the predetermined region of said substrate, whereby in the second step, said cavity self-aligning to said at least one isolation region may be formed.

Said predetermined region extends over a single semiconductor device element forming region of said substrate, whereby an embedded insulating region comprising said cavity may extend over said semiconductor device element forming region.

Said predetermined region extends over a single circuit block forming region of said substrate, whereby an embedded insulating region comprising said cavity may extend over said circuit block forming region.

Said semiconductor substrate may be a silicon substrate.

After said second step, it is possible to further include a process of forming at least one single crystal semiconductor layer on said substrate surface.

Moreover, although a third aspect of the present invention will be described hereinafter, the foregoing description in relation to the method of manufacturing a semiconductor substrate as the first aspect of the present invention will be applied to the following description of the present third aspect, so that double description will be avoided in practice. More specifically, the third aspect of the present invention is the method of manufacturing a semiconductor substrate, comprising:

a first step of selectively implanting ions into a predetermined region in a substrate, the implanted ions, in turn, forming a plurality of micro-cavities in said predetermined region; and a second step of giving heat treatment to the substrate, thereby allowing growth of said plurality of respective micro-cavities and further combination of adjacent micro-cavities with each other to form an embedded insulating region comprising a combined cavity present all over said predetermined region, wherein said combined cavity has a seamlessly uninterrupted inside surface, as well as has inner space completely closed from outside of said substrate by the inside surface;

wherein heat treatment in said second step includes high-temperature heat treatment, the high-temperature heat treatment allowing combination of adjacent micro-cavities with each other to form said combined cavity present all over said predetermined region, and wherein an oxide film at least filling inner space of said cavity is formed by carrying out said high-temperature heat treatment in oxygen rich atmosphere, during at least the last certain period of time of said high-temperature heat treatment.

The heat treatment in said second step allows said substrate to be softened due to inclusion of the high-temperature heat treatment carried out in a high temperature range of not less than 1000° C., and even if a surface of a substrate corresponding to a region in which said cavity is formed is elevated, in a moment when said cavity is formed within said substrate, allows the surface of the substrate to be returned to flatness at once, so that the surface of said substrate which is finally obtained is flat, and an interface between an upper portion of said cavity and said substrate is preferably parallel and flat to a flat surface of said substrate.

Said second step may further include low-temperature heat treatment carried out in a low-temperature region of not less than 400° C. through less than 700° C. in order to discharge said implanted ions outside of said substrate as gas before said high-temperature heat treatment.

Said second step may further include middle-temperature heat treatment carried out in a middle-temperature region of not less than 700° C. through less than 1000° C. in order to allow growth of said plurality of the respective micro-cavities before said high-temperature heat treatment.

Said second step may further include the low-temperature heat treatment carried out in the low-temperature region of not less than 400° C. through less than 700° C. in order to discharge said implanted ions outside of said substrate as gas, and the middle-temperature heat treatment carried out in the middle-temperature region of not less than 700° C. through less than 1000° C. to allow the growth of said plurality of the respective micro-cavities, before said high-temperature heat treatment.

Said low-temperature heat treatment may be carried out at a temperature of not less than 400° C. through less than 600° C., said middle-temperature heat treatment may be carried out at a temperature of not less than 800° C. through less than 1000° C., and said high-temperature heat treatment may be carried out at a temperature increased further from 1200° C.

It is possible to further include a process of removing a surface oxide film formed on the surface of said substrate by said high-temperature heat treatment carried out in said oxygen rich atmosphere after said high-temperature heat treatment.

Moreover, although a fourth aspect of the present invention will be described hereinafter, the foregoing description in relation to the method of manufacturing a semiconductor substrate as the first aspect of the present invention will be applied to the following description of the present fourth aspect, so that double description will be avoided in practice. More specifically, the fourth aspect of the present invention is the method of manufacturing a semiconductor substrate, comprising:

a first step of selectively implanting ions into a predetermined region in a substrate, the implanted ions, in turn, forming a plurality of micro-cavities in said predetermined region;

a second step of giving heat treatment to the substrate, thereby allowing growth of said plurality of respective micro-cavities and further combination of adjacent micro-cavities with each other to form an embedded insulating region comprising a combined cavity present all over said predetermined region; and a third step of forming at least one semiconductor device element in a surface region of the substrate on said embedded insulating region. Here, said combined cavity has a seamlessly uninterrupted inside surface as well as has inner space completely closed from outside of said substrate by the inside surface.

The heat treatment in said second step allows said substrate to be softened due to inclusion of high-temperature heat treatment carried out in a high temperature range of not less than 1000° C., and even if a surface of a substrate corresponding to a region in which said cavity is formed is elevated, in a moment when said cavity is formed within said substrate, allows the surface of the substrate to be returned to flatness at once, so that the surface of said substrate which is finally obtained is flat, and an interface between an upper portion of said cavity and said substrate is parallel and flat to a flat surface of said substrate. In said third step, said at least one semiconductor device element is preferably formed on said flat substrate surface.

In said second step, an oxide film at least coating an inside surface which completely closes said inner space of said cavity may be formed by carrying out at least said high-temperature heat treatment in said oxygen rich atmosphere.

Said oxide film has a thicker film thickness in a portion, which is formed on side walls of said cavity than in a portion, which is formed on inside upper and lower surfaces of said cavity.

Said oxide film may not only coat the inside surface of said cavity, but also include at least one columnar portion which is formed in the inner space of said cavity.

Said oxide film may not only coat the inside surface of said cavity, but also include at least one barrier-structure portion which is formed in the inner space of said cavity.

Said high-temperature heat treatment may be carried out in said oxygen rich atmosphere until said oxide film fills up the inner space of said cavity.

Said second step may further include a process of removing a surface oxide film formed on the surface of said substrate by carrying out said high-temperature heat treatment in said oxygen rich atmosphere after said high-temperature heat treatment, and may form said at least one semiconductor device element on the surface of said substrate after removing the surface oxide film in said third step.

It is possible that in said first step, at least one gate electrode structure is formed on said substrate, and said at least one gate electrode is used as a mask to selectively implant said ions into said substrate, that in said second step, said cavity self-aligning to said at least one gate electrode structure is formed, and that in said third step, a source region and a drain region are formed in said substrate.

It is possible that in said first step, at least one isolation region is formed in an upper portion region of said substrate, and said at least one isolation region is used as a mask to selectively implant said ions into said substrate, that in said second step, said cavity self-aligning to said at least one isolation region is formed, and that in said third step, said at least one semiconductor device element is formed in a surface region of said substrate above said cavity.

Said predetermined region extends over a single semiconductor device element forming region of said substrate, whereby an embedded insulating region comprising said cavity may extend over said semiconductor device element forming region.

Said predetermined region extends over a single circuit block forming region of said substrate, whereby an embedded insulating region comprising said cavity may extend over said circuit block forming region.

Said semiconductor substrate may be a silicon substrate.

It is possible to further include a process of forming at least one single crystal semiconductor layer on said substrate surface after said second step, and to form said at least one semiconductor device element on said at least one single crystal semiconductor layer in said third step.

Moreover, although a fifth aspect of the present invention will be described hereinafter, the foregoing description in relation to the method of manufacturing a semiconductor substrate as the first aspect of the present invention will be applied to the following description of the present fifth aspect, so that double description will be avoided in practice. More specifically, the fifth aspect of the present invention is a semiconductor substrate which comprises an embedded insulating region comprising a combined cavity present all over a predetermined region in a substrate, wherein said cavity has a seamlessly uninterrupted inside surface, as well as has inner space completely closed from outside of said substrate by the inside surface, said inside surface being coated with at least an oxide film.

A surface of said substrate is flat, and an interface between an upper portion of said cavity and said substrate is preferably parallel and flat to a flat surface of said substrate.

Said oxide film has a thicker film thickness in a portion, which is formed on side walls of said cavity than in a portion, which is formed on inside upper and lower surfaces of said cavity.

Said oxide film may not only coat said inside surface of said cavity, but also include at least one columnar portion extending in inner space of said cavity.

Said oxide film may not only coat said inside surface of said cavity, but also include at least one barrier-structure portion extending in the inner space of said cavity.

The inner space of said cavity may be filled with said oxide film.

Said cavity may self-align to at least one electrode present on said substrate.

Said cavity may self-align to at least one isolation region present on said substrate.

Said predetermined region extends over a single semiconductor device element forming region of said substrate, whereby an embedded insulating region comprising said cavity may extend over said semiconductor device element forming region.

Said predetermined region extends over a single circuit block forming region of said substrate, whereby the embedded insulating region comprising said cavity may extend over said circuit block forming region.

Said semiconductor substrate may be a silicon substrate.

Moreover, although a sixth aspect of the present invention will be described hereinafter, the foregoing description in relation to the method of manufacturing a semiconductor substrate as the first aspect of the present invention will be applied to the following description of the present sixth aspect, so that double description will be avoided in practice. More specifically, the sixth aspect of the present invention is a semiconductor substrate which comprises an embedded insulating region comprising a combined, flat-shaped cavity present all over a predetermined region in a substrate, wherein said cavity has a seamlessly uninterrupted inside surface, as well as has inner space completely closed from outside of said substrate by the inside surface, and wherein a surface of said substrate is flat, and an interface between an upper portion of said cavity and said substrate is parallel and flat to a flat surface of said substrate.

Said cavity may self-align to at least one electrode present on said substrate.

Said cavity may self-align to at least one isolation region present on said substrate.

Said predetermined region extends over a single semiconductor device element forming region of said substrate, whereby an embedded insulating region comprising said cavity may extend over said semiconductor device element forming region.

Said predetermined region extends over a single circuit block forming region of said substrate, whereby the embedded insulating region comprising said cavity may extend over said circuit block forming region.

Said semiconductor substrate may be a silicon substrate.

Moreover, although a seventh aspect of the present invention will be described hereinafter, the foregoing description in relation to the method of manufacturing a semiconductor substrate as the first aspect of the present invention will be applied to the following description of the present seventh aspect, so that double description will be avoided in practice. More specifically, the seventh aspect of the present invention is a semiconductor device comprising:

a semiconductor substrate including an embedded insulating region comprising a combined, flat-shaped cavity present all over a predetermined region, wherein said cavity has a seamlessly uninterrupted inside surface, as well as has inner space completely closed from outside of said substrate by the inside surface, said inside surface being coated with at least an oxide film; and at least one semiconductor device element which is present in a surface region of the semiconductor substrate on said embedded insulating region.

Said substrate surface is flat, and an interface between an upper portion of said cavity and said substrate is parallel and flat to a flat surface of said substrate.

It is preferable that said oxide film have a thicker film thickness in a portion, which is formed on side walls of said cavity than in a portion, which is formed on inside upper and lower surfaces of said cavity.

Said oxide film may not only coat said inside surface of said cavity, but also include at least one columnar portion extending in inner space of said cavity.

Said oxide film may not only coat said inside surface of said cavity, but also include at least one barrier-structure portion extending in the inner space of said cavity.

The inner space of said cavity may be filled with said oxide film.

Said cavity may self-align to at least one electrode present on said substrate.

Said cavity may self-align to at least one isolation region present on said substrate.

Said predetermined region extends over a single semiconductor device element forming region of said substrate, whereby an embedded insulating region comprising said cavity may extend over said semiconductor device element forming region.

Said predetermined region extends over a single circuit block forming region of said substrate, whereby the embedded insulating region comprising said cavity may extend over said circuit block forming region.

Said semiconductor substrate may be a silicon substrate.

Moreover, although an eighth aspect of the present invention will be described hereinafter, the foregoing description in relation to the method of manufacturing a semiconductor substrate as the first aspect of the present invention will be applied to the following description of the present eighth aspect, so that double description will be avoided in practice. More specifically, the eighth aspect of the present invention is a semiconductor device comprising:

a semiconductor substrate including an embedded insulating region comprising a combined, flat-shaped cavity present all over a predetermined region, wherein said cavity has a seamlessly uninterrupted inside surface, as well as has inner space completely closed from outside of said substrate by the inside surface, and wherein a surface of said substrate is flat, and an interface between an upper portion of said cavity and said substrate is parallel and flat to a flat surface of said substrate; and at least one semiconductor device element which is present in a surface region of the semiconductor substrate on said embedded insulating region.

Said cavity may self-align to at least one electrode present on said substrate.

Said cavity may self-align to at least one isolation region present on said substrate.

Said predetermined region extends over a single semiconductor device element forming region of said substrate, whereby an embedded insulating region comprising said cavity may extend over said semiconductor device element forming region.

Said predetermined region extends over a single circuit block forming region of said substrate, whereby the embedded insulating region comprising said cavity may extend over said circuit block forming region.

Said semiconductor substrate may be a silicon substrate.

BEST MODES FOR CARRYING OUT THE INVENTION

Next, with reference to the drawings, description will be given of the method of manufacturing a semiconductor substrate according to the present invention and the method of manufacturing a semiconductor device including the method of manufacturing a semiconductor substrate thereof in a process, as well as a semiconductor substrate manufactured by the method for enabling a semiconductor device to have said high performance characteristics and a semiconductor device using the semiconductor substrate, hereinafter.

The best mode for carrying out the following invention is typical examples of the best mode for realizing a plurality of embodiments of the present invention, and serves to facilitate understanding of the best mode for carrying out the present invention by giving the following more detailed description in one or more preferable embodiments with reference to the drawings, though the subject of the present invention is as fully described in the disclosure of the present invention earlier herein.

[1] Method of Forming a Semiconductor Substrate

FIG. 3A to FIG. 3E are partial longitudinal sectional views showing a substrate in a series of processes included in one typical example of the novel method of a semiconductor substrate according to the present invention.

Figure 1A:
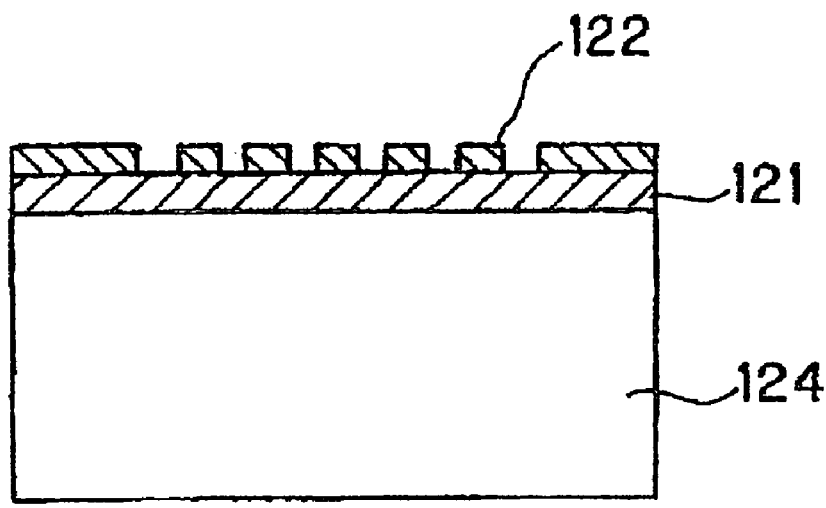
FIG. 1A to FIG. 1D are partial longitudinal sectional views of an SON substrate in each process according to a first conventional method of manufacturing the SON substrate.
Figure 1B:
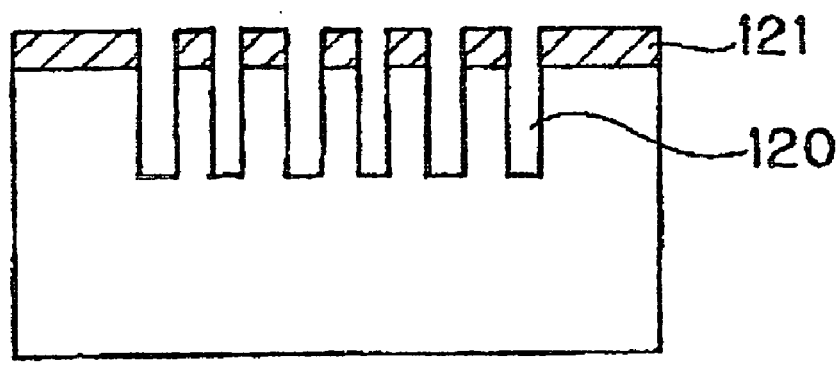
Figure 1C:
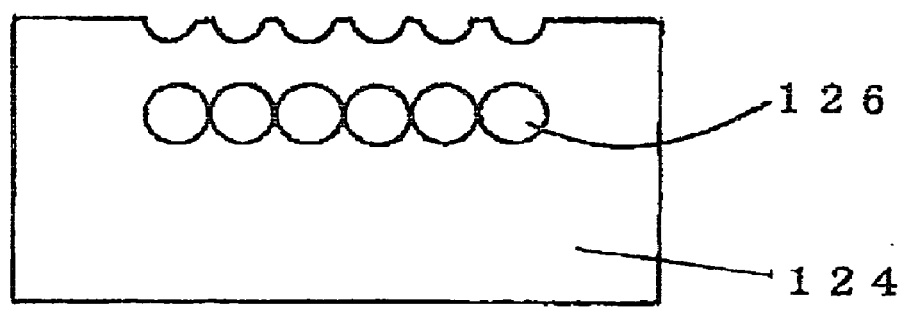
Figure 1D:
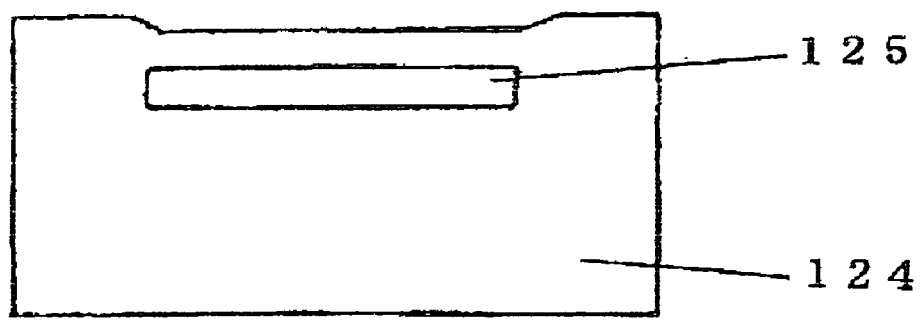
Figure 2A:
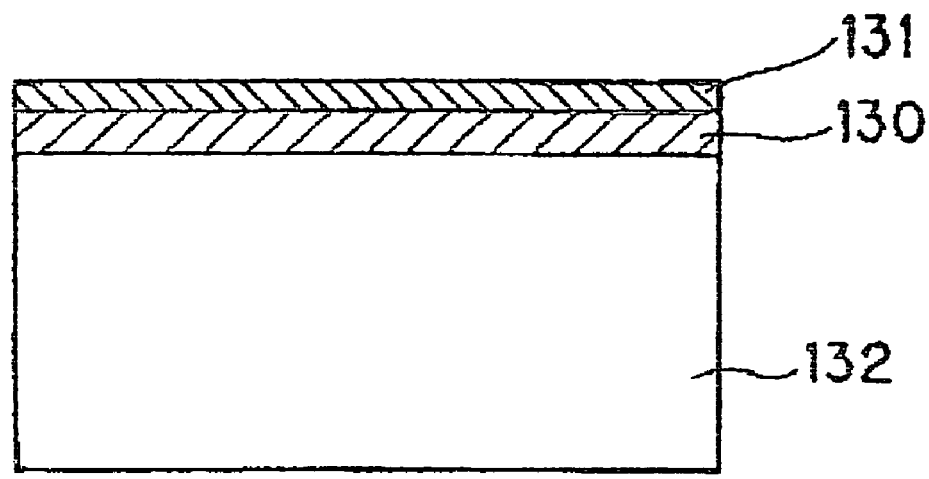
FIG. 2A to FIG. 2C are partial longitudinal sectional views of an SON substrate in each process according to a second conventional method of manufacturing the SON substrate.
Figure 2B:
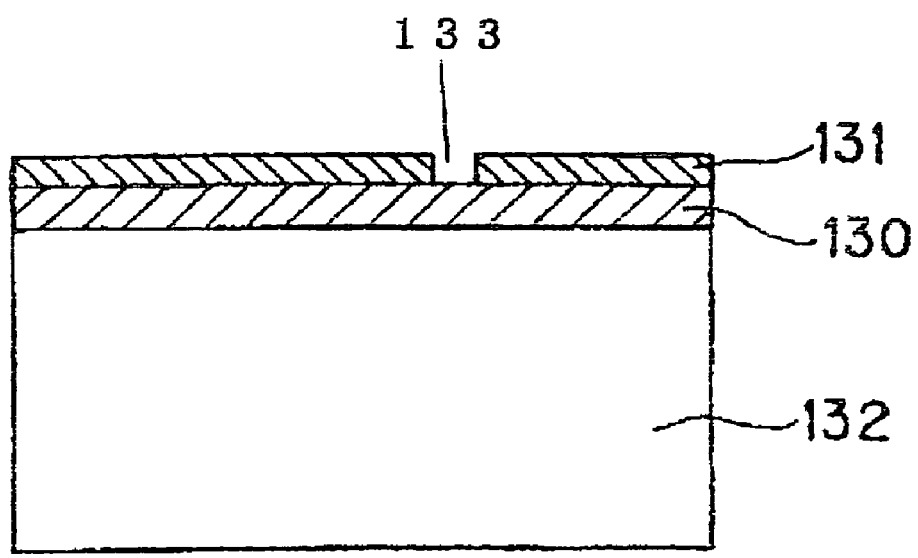
Figure 2C:
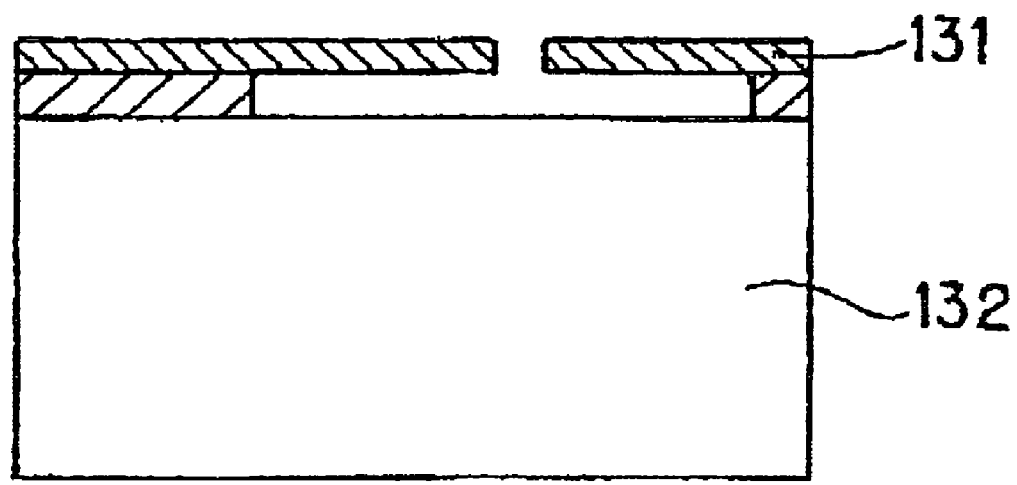
Figure 3A:
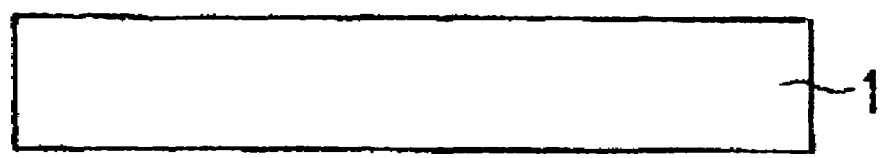
FIG. 3A to FIG. 3E are partial longitudinal sectional views showing a substrate in a series of processes included in one typical example of a novel method of manufacturing a semiconductor substrate according to the present invention.
Figure 3B:
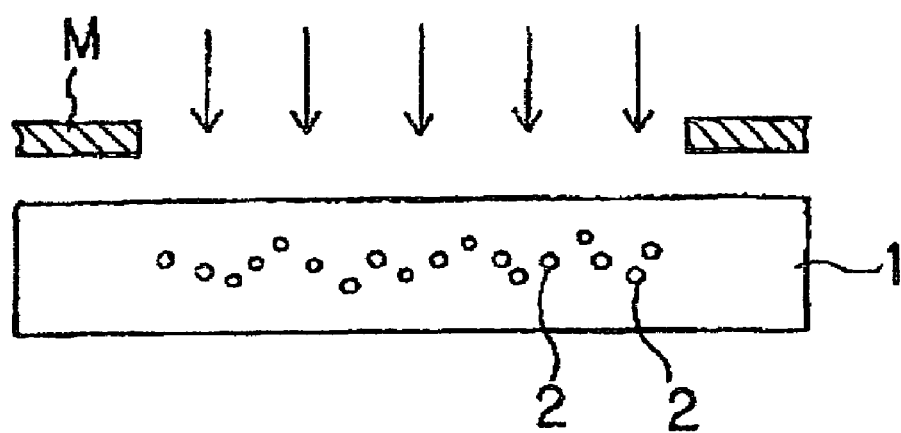

A substrate 1 shown in FIG. 3A is prepared. Then, as a first step, as shown in FIG. 3B, ions are selectively implanted into a predetermined region of the substrate 1 through a mask M to form a number of micro-cavities 2 distributed in the predetermined region.

Figure 3C:
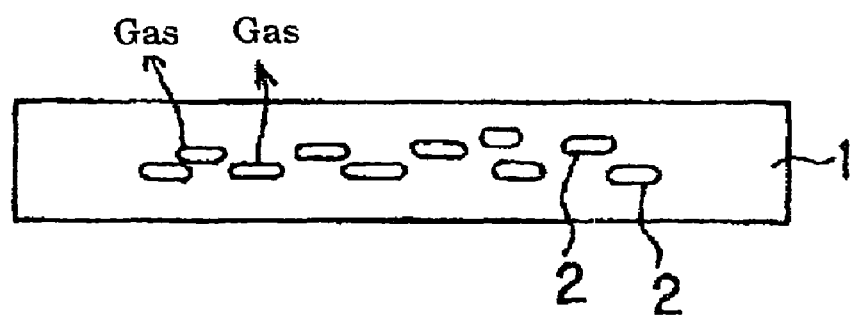
Figure 3D:
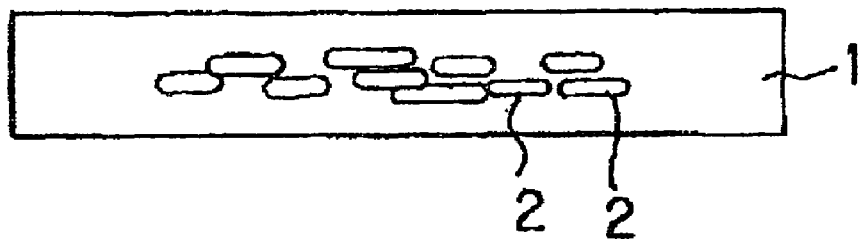
Figure 3E:
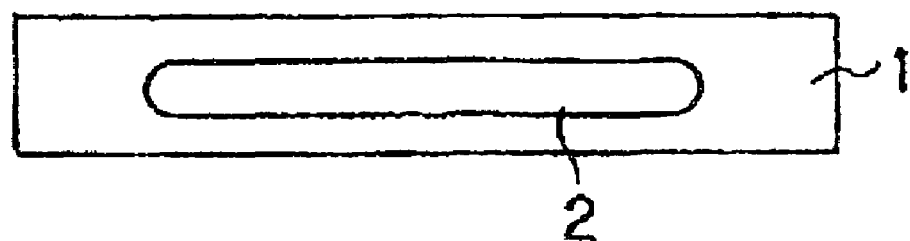

Subsequently, in a second step, the substrate 1 is subjected to heat treatment to discharge the ions in a number of the micro-cavities 2 outside of the substrate 1 as gas, as shown in FIG. 3C. As shown in FIG. 3D, the ions discharged as gas, in turn, cause growth of said number of the respective micro-cavities 2, enlargement of each size thereof, combination of the adjacent cavities 2 with each other, as shown in FIG. 3E, and finally formation of a combined, approximately flat-shaped cavity 2 spread all over the predetermined region of the substrate 1. This enables manufacturing of a substrate 10 having a cavity 2, that is, an SON substrate 10 in a predetermined region.

Hereinafter, description will be given regarding the best mode for carrying out the first step and the second step of the present invention.

(First Step)

In a first step, by selectively implanting ions into a predetermined region on a substrate 1, a number of micro-cavities 2 distributed over the region of the substrate 1 are formed.

The substrate 1 may be any substrate which is capable of being used as a semiconductor substrate, of forming micro-cavities 2 by implanting ions, and of allowing growth, and combination of the micro-cavities 2 to finally form the cavity 2 with a desired size in the second step to be described later, and is not particularly limited. A typical example of the substrate 1 includes a silicon substrate, semiconductor substrates other than silicon, an oxide substrate, a nitride substrate, an oxynitride substrate, or the like, but is not limited to these. Among these, the silicon substrate is particularly preferable.

The ions used to form the micro-cavities 2 in the substrate 1 in the first step are not also particularly limited in the present invention, and therefore the ions may be any ions which are capable of forming the micro-cavities 2. However, preferable are the ions which (A) cause no damage to the substrate 1 even being implanted into the substrate 1 at room temperature, and which (B) make it easier to control range distance for implantation thereof into a predetermined region of the substrate 1 (particularly, a desired depth from a substrate surface). The ions having such properties may include ions called, "so-called light ions", and specifically, include a hydrogen ion, a helium ion, a neon ion, and a fluorine ion.

The number of the micro-cavities are formed even with ion implantation at room temperature. More specifically, atoms in the substrate are desorbed by energy of the ion implantation to form the micro-cavities. Here, when ions to be implanted are light ions, adjacent ions collect together into gas.

Conditions under which such ions are implanted, for example, acceleration voltage and dose may be determined depending on which position of the substrate 1 (depth or range) and how much the ions should be implanted. In other words, the conditions under which the ions are implanted may be determined depending on what-like cavity 2 should be finally formed in the substrate 1, and are not particularly limited. As a typical example, it is preferable to set the acceleration voltage in a range of 5 keV to 150 keV, and to set the dose in the range of $5 \times 10^{15}$ to $1 \times 10^{18}/cm^2$.

In the first step, it is necessary to selectively implant the aforementioned ions into a region in which the cavity 2 should be finally formed, that is, into the predetermined region. It is a final object to use the semiconductor substrate 10 manufactured by the method of the present invention to manufacture a semiconductor device. However, the region in which the aforementioned cavity 2 should be formed may be determined randomly in view of what-like characteristics the semiconductor device is given, and therefore the present invention does not intend to particularly limit the region. Note that a relationship between the cavity 2 formed in the substrate 1 and the semiconductor device will be described later.

In addition, the method for selectively implanting ions only into the predetermined region of the substrate 1 is not particularly limited. For example, as shown in FIG. 3B, a mask member M which has an opening corresponding to the predetermined region may be placed on the substrate 1 to implant ions through the mask member M by known ion implantation methods.

Additionally, as an alternative method, STI (Shallow Trench Isolation) and/or a gate electrode are formed in a substrate to selectively determine a region into which ions are implanted so as to self-align to the STI and/or the gate electrode, whereby a region in which the cavity 2 should be formed may be selectively determined so as to self-align to the STI and/or the gate electrode, as will be described later.

(Second Step)

A second step is a step of giving heat treatment to a substrate 1 in which micro-cavities 2 are formed in a predetermined region in said first step, thereby allowing growth of a number of the respective micro-cavities 2, enlargement of respective size thereof, and combination of the adjacent micro-cavities with each other to finally form a combined cavity 2 spread all over said predetermined region. Said combined cavity 2 formed by the heat treatment in said second step has inner space completely closed from outside of said substrate by an inside surface of the cavity. Namely, the inner space is not communicating with outside of said substrate 1. In addition, by selecting a region into which ions are implanted it is possible to select a region over which the combined cavity 2 spreads. More specifically, when the predetermined region is a flat-shaped region approximately parallel to a surface of the substrate 1, the combined cavity 2 has also a flat-shape approximately parallel to the surface of the substrate 1.

The second step may include a process for exposing the substrate 1 to high-temperature heat treatment carried out in a high-temperature range of, for example, not less than 1000° C. as shown in FIG. 3E. In this manner, by carrying out the high-temperature treatment, the combined cavity 2 spread all over said predetermined region are finally formed based on a number of the micro-cavities 2 formed in said first step, on top of it, further providing additional softening of the substrate 1 itself. As a result, even if a substrate surface in a portion in which the cavity 2 is formed is elevated, in a moment when the cavity 2 is formed within the substrate 1 is elevated, the substrate surface can return to flatness at once, thus making it possible to keep the flatness of the substrate surface high.

The second step shown in FIG. 3C to FIG. 3E includes low-temperature heat treatment carried out in a low-temperature range of not less than 400° C. through less than 700° C. in order to discharge said implanted ions outside of said substrate as gas, as shown in FIG. 3C, middle-temperature heat treatment carried out in a middle-temperature range of not less than 700° C. through less than 1000° C. in order to allow growth of said number of the respective micro-cavities as shown in FIG. 3D, and the high-temperature heat treat carried out in the high-temperature range of not less than 1000° C. in order to allow combination of the adjacent micro-cavities with each other to form the combined cavity 2 present all over said predetermined region as shown in FIG. 3E. However, the second step is not required to limit to these three sub-steps. The low-temperature heat treatment and/or the middle-temperature heat treatment may also be omitted.

However, as shown in FIG. 3C to FIG. 3E, the second step preferably comprises said three sub-steps for the following reasons: In the low-temperature heat treatment shown in FIG. 3C, the implanted ions are discharged outside of the substrate 1 as gas. In the middle-temperature heat treatment shown in the subsequent FIG. 3D, the ions cause growth of a number of the respective micro-cavities 2 discharged as gas, as described above. In the high-temperature heat treatment shown in the further subsequent FIG. 3E, the ions cause further enlargement of size of said micro-cavities, and combination of the adjacent micro-cavities with each other to finally form the combined cavity 2 present all over said predetermined region, as well as to keep the flatness of the substrate surface as described above. This combined cavity 2 is flat-shaped approximately parallel to the substrate surface. The flat-shape approximately parallel to this substrate surface corresponds to the flat-shape approximately parallel to the substrate surface which said predetermined region has.

Detailed conditions in carrying out the second step, such as heat treatment atmosphere, temperature, rate of temperature increase, and time, may be determined randomly in view of the size of the cavity which is finally formed. As one typical example, the heat treatment atmosphere is made Ar atmosphere containing 0.5% of $O_2$. The low-temperature heat treatment shown in FIG. 3C is carried out in a low-temperature region of 400° C. to 600° C. for two hours, and then the middle-temperature heat treatment shown in FIG. 3D is carried out in a middle-temperature region of 800° C. to 1000° C. for two hours. Furthermore, the high-temperature heat treatment shown in FIG. 3E is carried out at a high temperature of 1350° C. increased from 1200° C. at a slow rate of temperature increase of 0.02° C./min. for five hours, thereby making it possible to form a flat-shaped cavity 2 approximately parallel to a flat substrate surface.

Figure 3F:
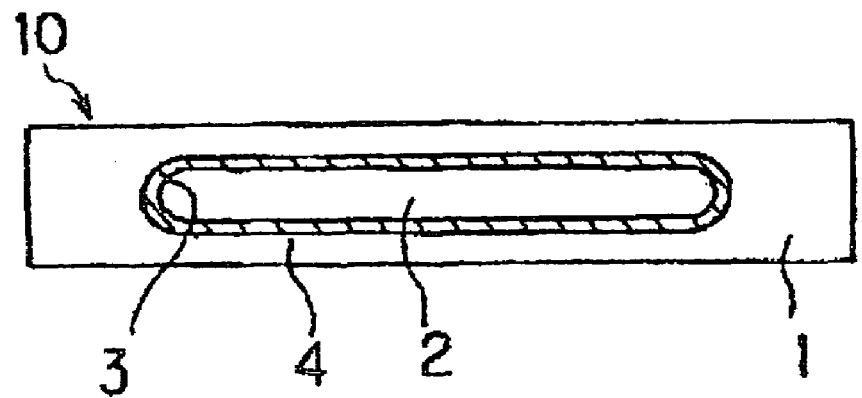
FIG. 3F is a partial longitudinal sectional view showing an SON substrate having a cavity whose inside surface is coated with an oxide film, which is formed when high-temperature heat treatment shown in FIG. 3E is carried out in oxygen rich atmosphere.

Additionally, in the method of the present invention, both said low-temperature heat treatment and said middle-temperature heat treatment may be carried out in the Ar atmosphere containing 0.5% of $O_2$, and said high-temperature heat treatment may be carried out in oxygen rich atmosphere. FIG. 3F is a partial longitudinal sectional view showing an SON substrate 10 having a cavity whose inside surface is coated with an oxide film, which is formed in the case where the high-temperature heat treatment shown in FIG. 3E is carried out in the oxygen rich atmosphere. Carrying out the high-temperature heat treatment in oxygen atmosphere provides the SON substrate 10 in which an oxide film 4 excellent in insulation characteristics is formed on an inside surface 3 of the cavity 2 formed in a predetermined region of the substrate 1, as shown in FIG. 3F.

In the case where the high-temperature heat treatment is carried out in the oxygen atmosphere, it is not necessary to make all the time for carrying out the high-temperature heat treatment oxygen atmosphere, instead, only a certain time may be used for the high-temperature heat treatment in the oxygen atmosphere, and the rest of the time may be used for the high-temperature heat treatment in the Ar atmosphere containing 5% of $O_2$. When carrying out the high-temperature heat treatment for five hours, the latter half, for example, only the last one hour may be used for the high-temperature heat treatment in the oxygen atmosphere. In this manner, the reason for which only the last certain period of time is used for carrying out the high-temperature heat treatment is that the high-temperature heat treatment is carried out to cause further growth and combination of the micro-cavities formed in the substrate, as described above, but that during when the micro-cavities are growing or combining with each other, the oxide film is prevented from being formed on the inside surfaces of the approximately micro-cavities without fail. This is because that once the oxide film is formed on the inside surfaces of the micro-cavities, there is a possibility that the oxide film interferes with the subsequent further growth and the combination of the micro-cavities with each other.

Oxygen atoms contained in the oxygen atmosphere are introduced into the inner space of said cavity 2 completely closed from the surface of said substrate 1 through a substrate upper portion region by the high-temperature heat treatment, and the introduced oxygen, in turn, oxides the inside surface of said cavity 2 to form the oxide film 4 on the inside surface 3 of said cavity 2. In addition to the aforementioned action effect, the oxide film 4 may be formed on the inside surface 3 of said cavity 2 by carrying out the high-temperature heat treatment in the oxygen rich atmosphere. Forming the oxide film 4 on the inside surface 3 of the cavity 2 increases insulation characteristics in the cavity 2, enabling further reduction and cut of leakage current.

And, by adjusting oxygen content in the oxygen atmosphere, or oxygen concentration, it is possible to adjust a film thickness of the oxide film 4 formed on the inside surface 3 of the cavity 2. In other words, by increasing the oxygen content in the oxygen atmosphere, or the oxygen concentration, it is possible to increase the film thickness of the oxide film 4 which is formed on the inside surface 3 of the cavity 2.

According to the present invention, an amount of oxygen contained in the oxygen atmosphere, or the oxygen concentration in carrying out the high-temperature heat treatment is not particularly limited, and may be determined randomly depending on the film thickness of the oxide film to be formed. Increase in the amount of the oxygen contained in the atmosphere, or the oxygen concentration causes the film thickness of the oxide film 4 coating the inside surface of the cavity 2 formed within the substrate 10 to be increased.

Figure 3G:
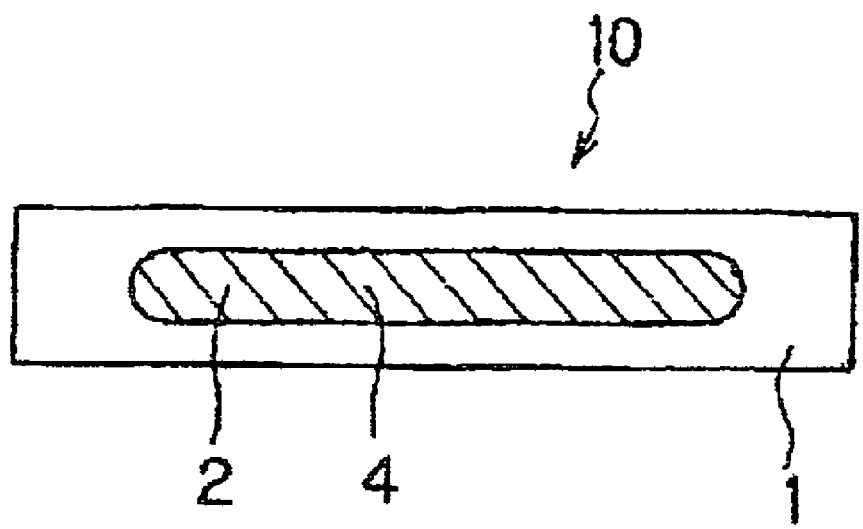
FIG. 3G is a partial longitudinal sectional view showing a partial SOI substrate having a cavity whose inner space is filled with an oxide film, which is formed when high-temperature heat treatment shown in FIG. 3E is carried out in oxygen rich atmosphere, or high oxygen concentration.

FIG. 3G is a partial longitudinal sectional view showing a partial SOI substrate having a cavity whose inner space is filled with an oxide film formed when the high-temperature heat treatment shown in FIG. 3E is carried out in oxygen content-rich atmosphere, or in high oxygen concentration atmosphere. More specifically, as shown in FIG. 3G, by increasing the oxygen content in the atmosphere, that is, by elevating the oxygen concentration, it is also possible to further increase the film thickness of the oxide film 4 which is formed on the inside surface 3 of the cavity 2 and to fill up the cavity 2 with the oxide film 4. A substrate 20 whose cavity 2 thus manufactured is filled with the oxide film 4 may be regarded as having an SOI structure in part.

Note that, in the method of manufacturing a semiconductor substrate of the present invention, all sub-steps included in the second step, that is, the low-temperature heat treatment and the middle-temperature heat treatment as well as the high-temperature heat treatment may also be carried out in the oxygen atmosphere. Here, there is fear that when carrying out the low-temperature heat treatment or the middle-temperature heat treatment in the oxygen atmosphere, the inside surfaces of the micro-cavities 2 are oxidized to interfere with the subsequent growth and combination of the micro-cavities 2. However, these low-temperature heat treatment and middle-temperature heat treatment require less high temperature, so that the oxygen in the atmosphere is unlikely to enter into the substrate 1, with no oxidized inside surfaces of the micro-cavities 2 in practice. Accordingly, the possibility to produce substantial negative effect on a process of the growth and combination of the micro-cavities 2 is low.

As has been described hereinbefore, according to the method of manufacturing a semiconductor substrate of the present invention, as the first step, ions are selectively implanted into the predetermined region of the substrate 1, to form a number of the micro-cavities 2 distributed in the predetermined region. Furthermore, as the second step, giving the heat treatment to the substrate 1 in which the micro-cavities 2 have been formed allows growth of said micro-cavities 2 and combination of the adjacent micro-cavities 2 with each other to form an approximately flat-shaped cavity 2 approximately parallel to the substrate surface in the substrate 1, thereby forming the SON semiconductor substrate 1 having the cavity 2.

In addition, when the high-temperature heat treatment is carried out in the oxygen atmosphere, the inside surface 3 of the cavity 2 is not only oxidized, but also the surface of the substrate 1 is deservingly oxidized, with formation of an oxide film not shown on the surface of the substrate 1. As described above, it is possible to adjust a thickness of a region on the substrate surface which is oxidized by adjusting the oxygen content in the oxygen atmosphere, or the oxygen concentration. It is therefore possible to adjust the film thickness of the oxide film which is formed on the surface of the substrate 1 and is not shown. And, the oxide film which has been formed on the substrate surface by the high-temperature heat treatment in the oxygen atmosphere and is not shown is removed, namely, scraped away. In the SON substrate 10 or the partial SOI substrate 20 after removal of the oxide film, a region above the cavity is usable as an active layer. In this case, distance between the substrate surface and an upper portion of the cavity after the removal of the oxide film corresponds to a thickness of the active layer. Accordingly, it is possible to adjust the thickness of the active layer of the SON substrate 10 or the partial SOI substrate 20 after the removal of the oxide film, which is not shown by adjusting the film thickness of the oxide film which has been formed on the surface substrate and is not shown and the film thickness of the oxide film which has been formed on the inside surface of said cavity. More specifically, if the oxygen content in the oxygen atmosphere, or the oxygen concentration is raised, and the film thickness of the oxide film which is formed on the substrate surface is increased, the thickness of the active layer of the SON substrate 10 or the partial SOI substrate 20 which is finally obtained after the removal of the oxide film is reduced. If the oxygen content in the oxygen atmosphere, or the oxygen concentration is decreased, and the film thickness of the oxide film which is formed on the substrate surface is reduced, the thickness of the active layer of the SON substrate 10 or the partial SOI substrate 20 which is finally obtained after the removal of the oxide film is increased.

As shown in FIGS. 3E, 3F, and 3G, the integrally formed cavity 2 has inner space which is completely closed from outside of said substrate 1 by the inside surface 3. Namely, the inner space is not communicating with the outside of said substrate 1. Accordingly, in order to avoid the heat treatment at an excessively high temperature and to realize formation of an insulating film in said cavity 2, the heat treatment is preferably carried out at a high temperature in the oxygen rich atmosphere to introduce the oxygen into the cavity. In order to carry out the heat treatment in other atoms, for example, nitrogen rich atmosphere to introduce the other atoms into the cavity 2, the heat treatment at a temperature higher than in the case of the oxygen is necessary. Accordingly, it is difficult to form insulating films other than the oxide film 4 on the inside surface 3 of the cavity 2 by the heat treatment as compared with the case of forming the aforementioned oxide film 4. In addition, in order to improve conditions of an interface between the insulating film 4 and said substrate which is formed on the inside surface 3 of the cavity 2, it is preferable that said substrate 1 be a silicon substrate and the oxide film 4 be oxide silicon.

As has been described hereinbefore, according to the present invention, the second step includes a sub-step comprising the high-temperature heat treatment which exposes the substrate 1 to a temperature of not less than 1000° C., so that the substrate 1 itself is softened by being exposed to a high temperature, while the micro-cavities 2 grow and combine with each other. As a result, the substrate surface can return to flatness at once, even if the substrate surface in a portion in which the cavity 2 is formed is elevated in a moment when the cavity 2 is formed within the substrate. More specifically, the elevated portion is smoothed, thus enabling manufacturing of the SON substrate 1 with high surface flatness shown in FIG. 3E.

Additionally, during at least the last certain period of time of the high-temperature heat treatment, the high-temperature heat treatment is carried out in the oxygen atmosphere to thereby form the oxide film 4 coating the inside surface 3 to provide the SON substrate 10 shown in FIG. 3F.

Furthermore, the oxygen content in the oxygen atmosphere, or the oxygen concentration is increased to thereby form the oxide film 4 filling up the cavity 2 to provide the partial SOI substrate 20 shown in FIG. 3G.

The insulating film which is formed on the inside surface 3 of the cavity 2 can be made a multi-layer structure including the oxide film 4, though being not shown. In this case, as shown in FIG. 3F, it is also possible that after forming the oxide film 4 on the inside surface 3 of the cavity 2 by the aforementioned method, at least one communication hole not shown, which allows communication between said cavity 2 and the outside of said substrate 1 is formed, at least one other insulating film not shown is further formed on the oxide film 4 coating the inside surface 3 of the cavity 2 through the communication hole, and a multilayer insulating structure coating the inside surface 3 of the cavity 2 is formed, as required. In this case, insulating materials constituting insulating films other than oxide films include all materials exhibiting insulation characteristics. However, when said substrate 1 is silicon, said oxide film 4 is preferably oxide silicon. Typical examples of the other insulating films include alumina, aluminum nitride, zirconium oxide, and hafnium oxide silicon, but are not limited to these by any means.

Additionally, it is possible that even if the oxide film 4 is not formed on the inside surface 3 of the cavity 2 by said high-temperature heat treatment as shown in FIG. 3E, after forming the cavity 2 by the aforementioned method, at least one communication hole which allows communication of said cavity 2 with the outside of said substrate 1 is formed, and at least one insulating film is formed on the inside surface 3 of the cavity 2 through the communication hole, as required.

[2] Method of Manufacturing a Semiconductor Device

The method of manufacturing a semiconductor device of the present invention includes a manufacturing process of the method of manufacturing the aforementioned semiconductor substrate in the process of manufacturing the semiconductor device. Namely, a semiconductor device is manufactured on the substrate using the semiconductor substrate manufactured in accordance with the method of manufacturing the aforementioned semiconductor substrate.

The method of manufacturing the aforementioned semiconductor substrate makes it possible to form an approximately flat-shaped cavity 2 excellent in insulation characteristics in a predetermined region of a substrate 1, or a cavity 2 having an oxide film 4 on an inside surface 3, or a cavity 2 whose inner space is filled with the oxide film 4 in approximately parallel to a substrate surface. Hence, a semiconductor device is formed on the substrate 1 having the flat-shaped cavity 2 excellent in insulation characteristics in the predetermined region, thereby providing reduced leakage current of the semiconductor device. This provides further increased integration degree of semiconductor Ultra Large Scale Integration such as an MOS transistor, further decreased electrical power consumption, and further enhanced high-speed operating characteristics.

First Embodiment

Figure 4A:
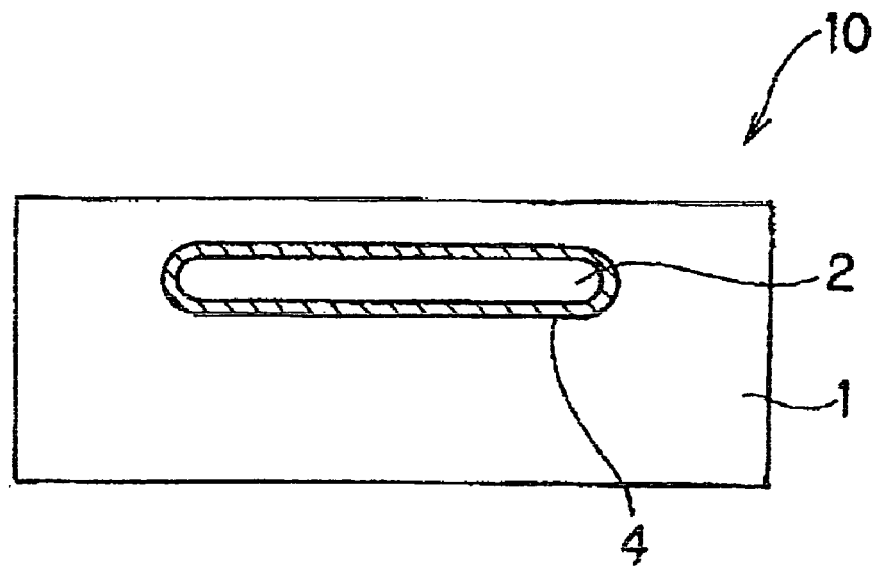
FIG. 4A and FIG. 4B are partial longitudinal sectional views showing a semiconductor substrate and a semiconductor device in a process included in a method of manufacturing a semiconductor device according to a first embodiment of the present invention.
Figure 4B:
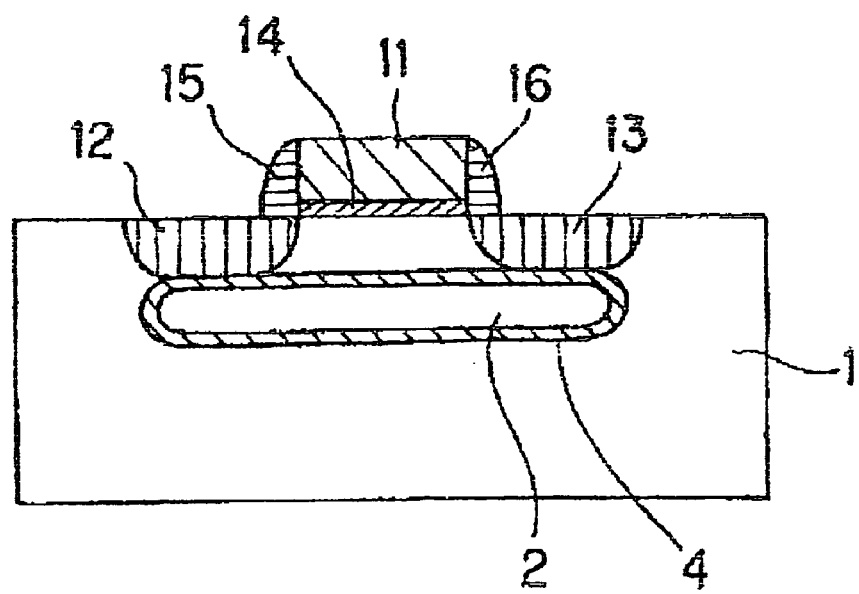

FIG. 4A and FIG. 4B are partial longitudinal sectional views showing a semiconductor substrate and a semiconductor device in a process included in the method of manufacturing a semiconductor device according to a first embodiment of the present invention.

With reference to FIG. 3A to FIG. 3F, an SON semiconductor substrate 10 shown in FIG. 4A is manufactured according to the method of manufacturing the aforementioned semiconductor substrate of the present invention. The semiconductor substrate 10 has an approximately flat-shaped cavity 2 approximately parallel to a substrate surface, and an inside surface 3 of the cavity 2 is coated with an oxide film 4. A field-effect transistor shown in FIG. 4B is formed in an active region directly above the cavity 2 formed within the semiconductor substrate 10. A gate electrode 11, a source region 12, a drain region 13, a gate insulating film 14, and side walls 15 and 16 of the field-effect transistor may be respectively formed according to known methods. Here, lower portions of the source region 12 and the drain region 13 abut on an upper portion of the cavity 2.

According to this method, the field-effect transistor is designed to have the cavity 2 excellent in insulation characteristics, so that leakage current can be minimized thus providing further decreased electrical power consumption and further enhanced high-speed operating characteristics of the semiconductor device.

Furthermore, the lower portions of the source region 12 and the drain region 13 abut on the upper portion of the cavity 2, enabling reduced parasitic capacitance caused by p-n junction that the source region 12 and the drain region 13 have, and further enhanced high-speed operating characteristics of the field-effect transistor.

Moreover, in the method of manufacturing a semiconductor device according to the present embodiment, during at least the last period of time in a high-temperature heat treatment process, high-temperature heat treatment in oxygen atmosphere is carried out to thereby form the oxide film 4 coating the inside surface of the cavity 2. However, a semiconductor substrate whose inner space of the cavity 2 is filled with the oxide film may be manufactured to form a semiconductor device on the semiconductor substrate by increasing oxygen content in the oxygen atmosphere, namely, by increasing oxygen concentration in the oxygen atmosphere, as shown in FIG. 3G. Alternatively, a semiconductor substrate with no oxide film may be manufactured in the cavity 2 to form a semiconductor device on the semiconductor substrate by carrying out the high-temperature heat treatment in oxygen poor atmosphere or oxygen absent atmosphere, as shown in FIG. 3E.

Second Embodiment

Figure 5A:
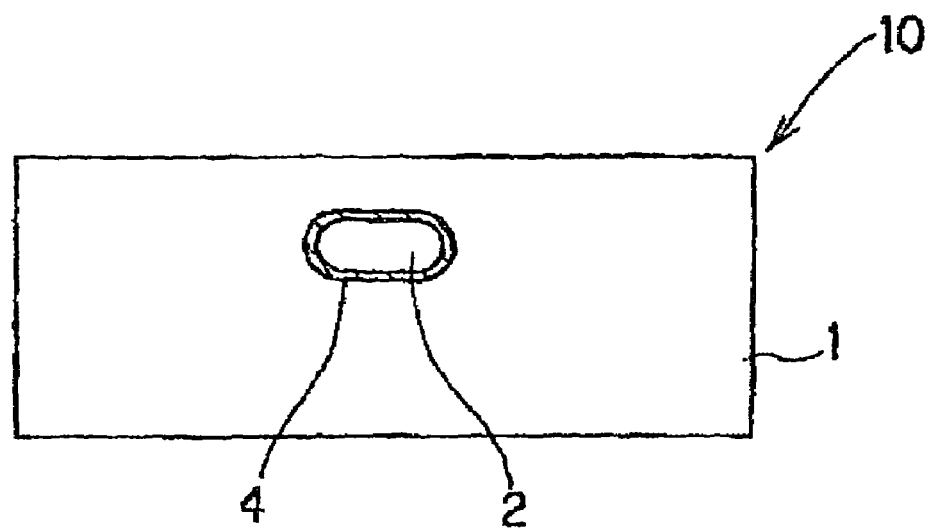
FIG. 5A and FIG. 5B are partial longitudinal sectional views showing a semiconductor device in a process included in a method of manufacturing a semiconductor device according to a second embodiment of the present invention.
Figure 5B:
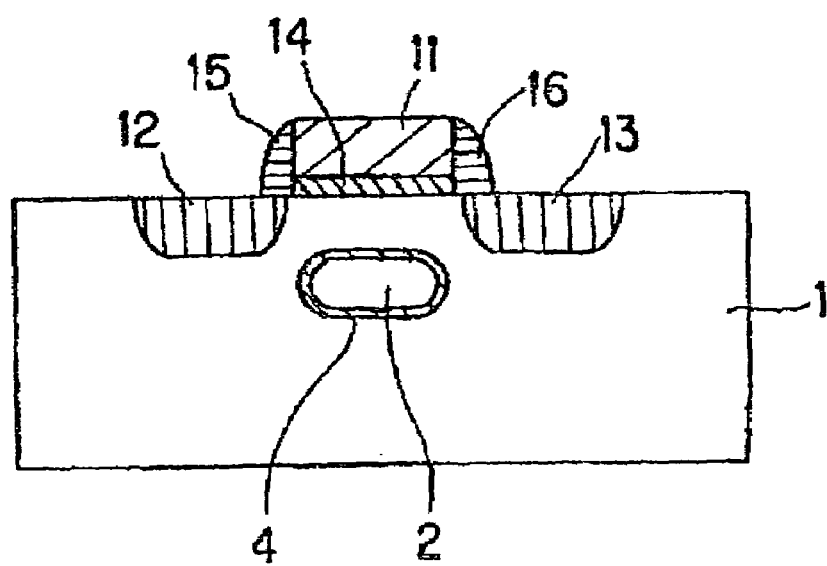

FIG. 5A and FIG. 5B are partial longitudinal sectional views showing a semiconductor device in a process included in the method of manufacturing a semiconductor device according to a second embodiment of the present invention.

The method of manufacturing a semiconductor device according to the second embodiment shown in FIG. 5A and FIG. 5B is basically the same as that of said first embodiment, but a positional relationship between a cavity 2 formed within a substrate and a field-effect transistor as a semiconductor device element differs from that of the first embodiment. In the method of manufacturing the aforementioned semiconductor substrate with reference to FIG. 3A to FIG. 3F, a semiconductor substrate 10 shown in FIG. 5A, in which the cavity 2 is formed is manufactured so that an area in which the cavity 2 which is finally formed is projected onto a surface of a substrate 1 may account for 80 to 100% of an area in which a gate electrode 11 which is formed on a surface of the substrate 1 is projected onto the surface of the substrate. A field-effect transistor shown in FIG. 5B is formed above the cavity 2 formed within the semiconductor substrate. A gate electrode 11, a source region 12, a drain region 13, a gate insulating film 14, and side walls 15 and 16 of the field-effect transistor may be respectively formed according to known methods. Here, the cavity 2 extends under a channel region beneath the gate electrode 11, but not under the side walls 15 and 16, and under the source region 12 and the drain region 13.

This method also enables manufacturing of a semiconductor device having element characteristics and circuit characteristics similar to those of the first embodiment.

Moreover, in the method of manufacturing a semiconductor device according to the present embodiment, during at least the last period of time in a high-temperature heat treatment process, high-temperature heat treatment in oxygen atmosphere is carried out to thereby form an oxide film 4 coating the inside surface of the cavity 2. However, an SOI semiconductor substrate whose inner space of the cavity 2 is filled with the oxide film may be manufactured to form a semiconductor device on the SOI semiconductor substrate, as shown in FIG. 3G by increasing oxygen content in the oxygen atmosphere, that is, by increasing oxygen concentration in the oxygen atmosphere. Alternatively, an SON semiconductor substrate with no oxide film found in the cavity 2 may be manufactured to form a semiconductor device on the SON semiconductor substrate, as shown in FIG. 3E by carrying out the high-temperature heat treatment in oxygen poor atmosphere or in oxygen absent atmosphere.

Third Embodiment

FIG. 6A to FIG. 6D are partial longitudinal sectional views showing a semiconductor device in a process included in the method of manufacturing a semiconductor device according to a third embodiment of the present invention.

Figure 6A:
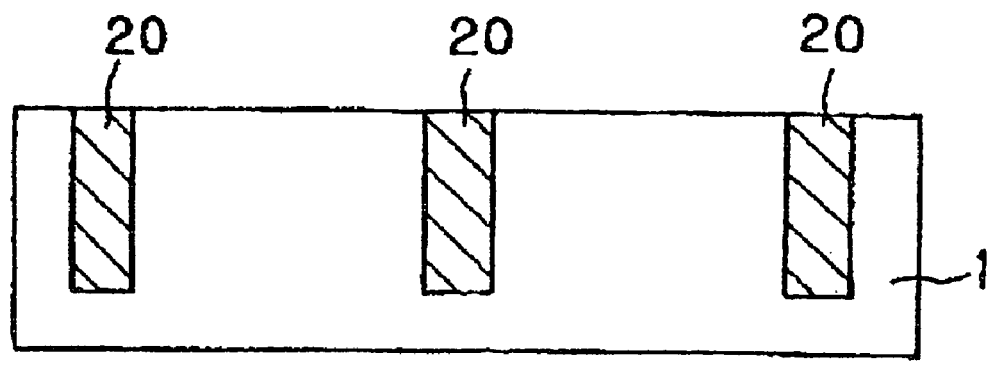
FIG. 6A to FIG. 6D are partial longitudinal sectional views showing a semiconductor device in a process included in a method of manufacturing a semiconductor device according to a third embodiment of the present invention.
Figure 6B:
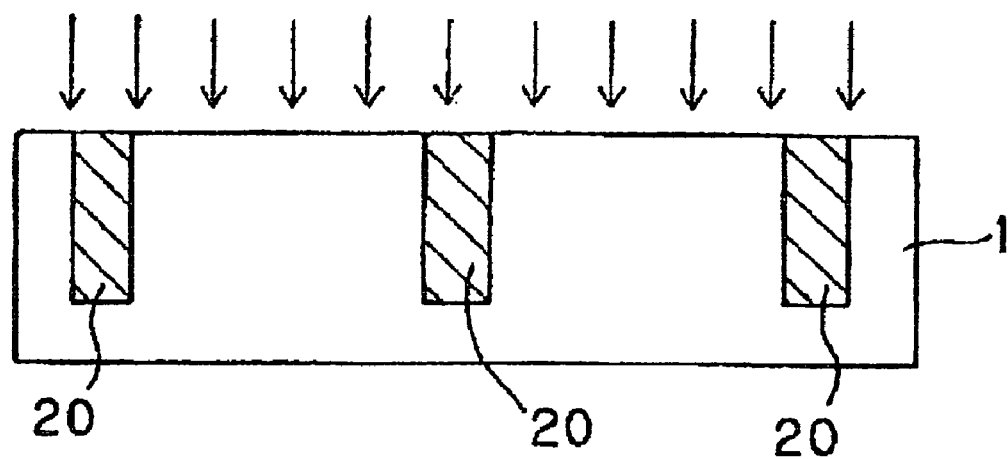

As shown in FIG. 6A, a region in which a cavity should be formed later is defined by forming a plurality of respective STIs (Shallow Trench Isolation) 20 on a substrate 1. Subsequently, as shown in FIG. 6B, a number of micro-cavities are formed only in a region self-aligned to the STIs 20 by implanting ions into the whole substrate 1. On the other hand, the ions are also implanted into the STIs 20, but the micro-cavities are not formed inside the STIs 20, provided that it is necessary to shallow range distance at which the ions are implanted, that is, a depth at which the ions are implanted, more than the depth of a bottom portion of the STIs 20 formed on the substrate 1.

Figure 6C:
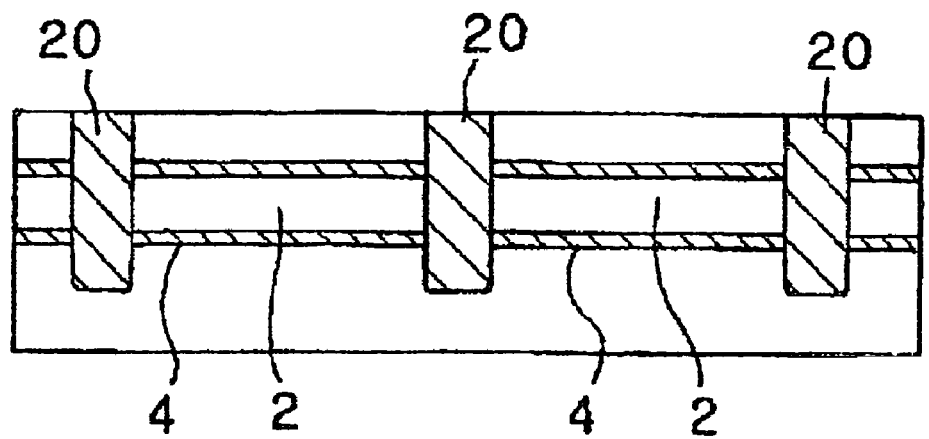

Subsequently, with reference to FIG. 3C to FIG. 3F, the aforementioned heat treatment is carried out to thereby allow growth and combination of a number of the micro-cavities which have been selectively formed only in the region self-aligned to the STIs 20 to manufacture an SON semiconductor substrate 10 having an approximately flat-shaped cavity 2 which is approximately parallel to a substrate surface and self-aligning to the STIs 20, and of which inside surface is further coated with an oxide film 4, as shown in FIG. 6C.

Figure 6D:
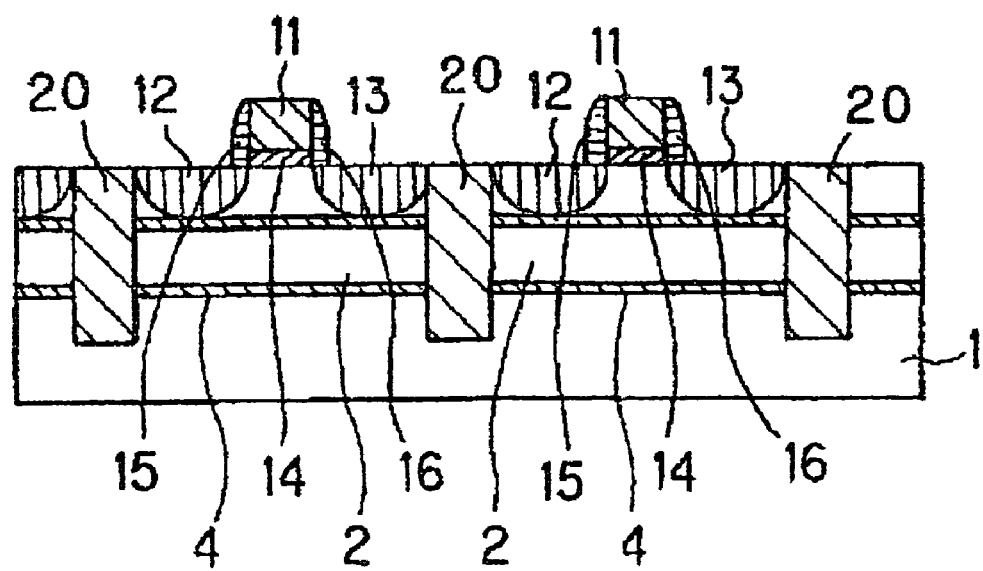

Thereafter, a field-effect transistor shown in FIG. 6D is formed in an active region above the cavity 2 self-aligned to the STIs 20. A gate electrode 11, a source region 12, a drain region 13, a gate insulating film 14, and side walls 15 and 16 of the field-effect transistor may be respectively formed according to known methods. Here, lower portions of the source region 12 and the drain region 13 abut on an upper portion of the cavity 2.

According to this method, the semiconductor device is designed to have the cavity 2 excellent in insulation characteristics, so that leakage current can be minimized, thus providing further decreased electrical power consumption and further enhanced high-speed operating characteristics of the semiconductor device.

Furthermore, the lower portions of the source region 12 and the drain region 13 abut on the upper portion of the cavity 2. Hence, parasitic capacitance caused by p-n junction that the source region 12 and the drain region 13 have is reduced, providing further enhanced high-speed operating characteristics of the field-effect transistor.

Moreover, in the method of manufacturing a semiconductor device according to the present embodiment, during at least the last certain period of time in a high-temperature heat treatment process, the high-temperature heat treatment is carried out in oxygen atmosphere to thereby form an oxide film 4 coating an inside surface of the cavity 2. However, an SO semiconductor substrate whose inner space of the cavity 2 is filled with an oxide film may be manufactured to form a semiconductor device on the SOI semiconductor substrate as shown in FIG. 3G, by increasing oxygen content in the oxygen atmosphere, or by increasing oxygen concentration in the oxygen atmosphere. Alternatively, an SON semiconductor substrate with no oxide film found in the cavity 2 as shown in FIG. 3E may be manufactured to form a semiconductor device on the SON semiconductor substrate by carrying out the high-temperature heat treatment in oxygen poor atmosphere or in oxygen absent atmosphere.

Fourth Embodiment

FIG. 7A to FIG. 7D are partial longitudinal sectional views showing a semiconductor device in a process included in the method of manufacturing a semiconductor device according to a forth embodiment of the present invention.

Figure 7A:
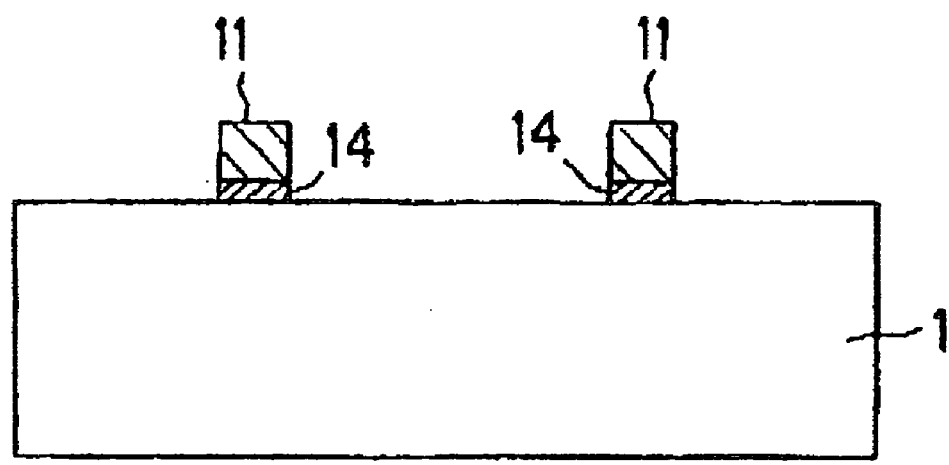
FIG. 7A to FIG. 7D are partial longitudinal sectional views showing a semiconductor device in a process included in a method of manufacturing a semiconductor device according to a fourth embodiment of the present invention.

As shown in FIG. 7A, a region in which cavities should be formed later in the substrate 1 is defined by forming a gate insulating film 14 and a gate electrode 11 on a substrate 1. The gate insulating film 14 and the gate electrode 11 may be respectively formed according to known methods.

Figure 7B:
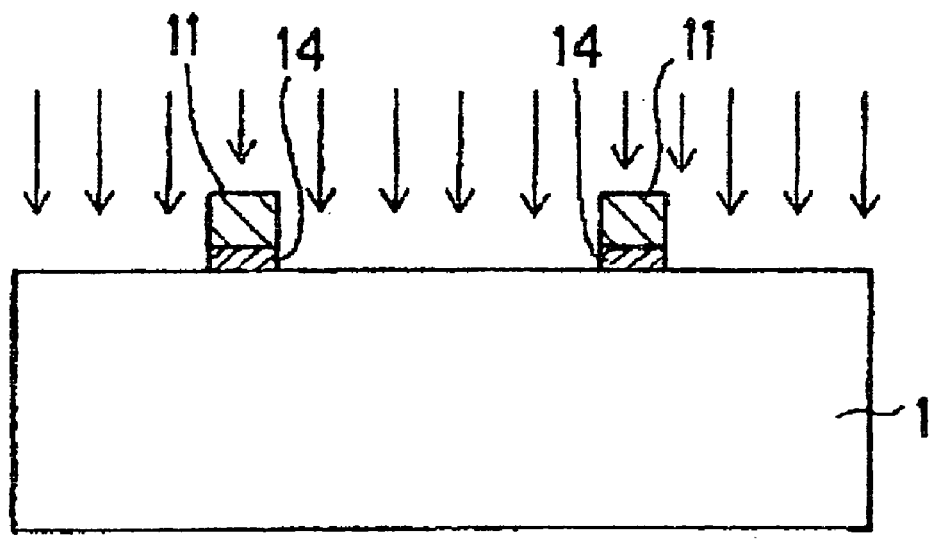

Subsequently, as shown in FIG. 7B, a number of micro-cavities are formed only in a region self-aligned to the gate electrode 11 by implanting ions into the whole substrate 1 making the gate electrode 11 as a mask. The ions are not implanted into a region under the gate electrode 11, because the gate electrode 11 acts as the mask. Thus, micro-cavities are not formed in the region under the gate electrode 11. Accordingly, a number of the micro-cavities are selectively formed only in a region self-aligned to the gate electrode 11.

Figure 7C:
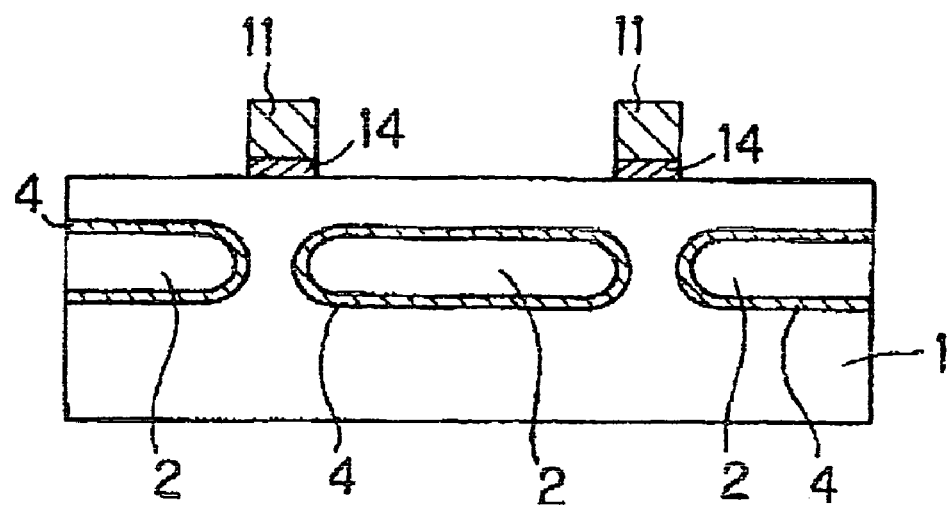

Thereafter, with reference to FIG. 3C to FIG. 3F, the aforementioned heat treatment is carried out to thereby allow growth and combination of a number of the micro-cavities which have been selectively formed only in the region self-aligned to the gate electrode 11 to manufacture an SON semiconductor substrate 10 shown in FIG. 7C, which has an approximately flat-shaped cavity 2 which is approximately parallel to a substrate surface and self-aligning to the gate electrode 11, and of which inside surface is further coated with an oxide film 4.

Figure 7D:
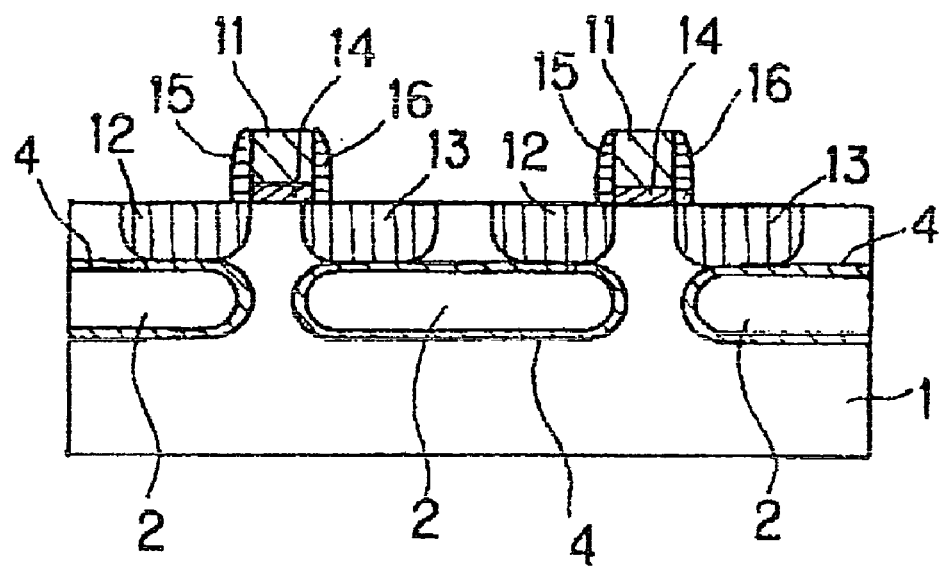

A field-effect transistor shown in FIG. 7D is then formed on the SON semiconductor substrate 10. A source region 12, a drain region 13, and side walls 15 and 16 of the field-effect transistor may be respectively formed according to known methods. Here, lower portions of the source regions 12 and the drain regions 13 abut on upper portions of the cavities 2.

According to this method, the semiconductor device is designed to have the cavity 2 excellent in insulation characteristics, so that leakage current can be minimized, thus providing further decreased electrical power consumption and further enhanced high-speed operating characteristics of the semiconductor device.

Furthermore, the lower portions of the source regions 12 and the drain regions 13 abut on the upper portions of the cavities 2. Hence, parasitic capacitance caused by p-n junction which the source regions 12 and the drain regions 13 have are reduced, providing further enhanced high-speed operating characteristics of the field-effect transistor.

According to this method, the cavities 2 self-aligning to the gate electrode 11 can be formed by carrying out ion implantation making the gate electrode 11 as a mask. This method eliminates the necessity of using a mask M exclusively for ion implantation in the method of manufacturing a semiconductor substrate of the present invention, and also eliminates the necessity of forming STIs 20 as with the third embodiment. Accordingly, the SON semiconductor substrate 10 can be used to easily and precisely manufacture a semiconductor device having excellent element characteristics and circuit characteristics.

Note that, in the method of manufacturing a semiconductor device according to the present fourth embodiment, the gate insulating film 14 and the gate electrode 11 are formed before carrying out an ion implantation process and the subsequent heat treatment process. However, in addition to the gate insulating film 14 and the gate electrode 11, the side walls 15 and 16 may be formed on both sides of the gate electrode 11, before carrying out the ion implantation process and the subsequent heat treatment process. In this case, the respective cavities 2 self-align to the side-walls 15 and 16.

Moreover, in the method of manufacturing a semiconductor device according to the present embodiment, during at least the last period of time in a high-temperature heat treatment process, high-temperature heat treatment is carried out in oxygen atmosphere to thereby form an oxide film 4 coating an inside surface of the cavity 2. However, an SOI semiconductor substrate whose inner space of the cavity 2 is filled with an oxide film may be manufactured to form a semiconductor device on the SOI semiconductor substrate as shown in FIG. 3G by increasing oxygen content in the oxygen atmosphere, or oxygen concentration in the oxygen atmosphere. Alternatively, an SON semiconductor substrate with no oxide film found in the cavity 2 as shown in FIG. 3E may be manufactured to form a semiconductor device on the semiconductor substrate by carrying out the high-temperature heat treatment in oxygen poor atmosphere or in oxygen absent atmosphere.

Fifth Embodiment

FIG. 8A to FIG. 8G are partial longitudinal sectional views showing a semiconductor device in a process included in the method of manufacturing a semiconductor device according to a fifth embodiment of the present invention. The method of manufacturing a semiconductor device according to the present embodiment is equivalent to an application example of the method of manufacturing the semiconductor device according to the present fourth embodiment.

Figure 8A:
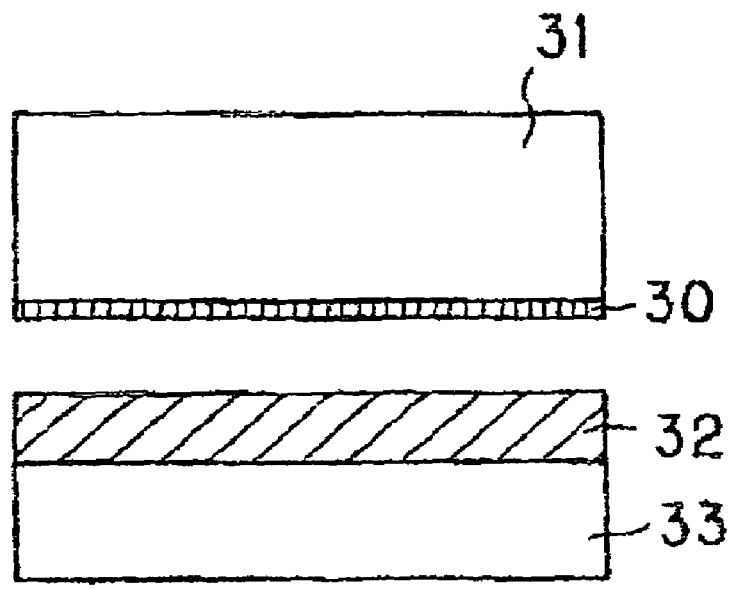
FIG. 8A to FIG. 8G are partial longitudinal sectional views showing a semiconductor device in a process included in a method of manufacturing a semiconductor device according to a fifth embodiment of the present invention.
Figure 8B:
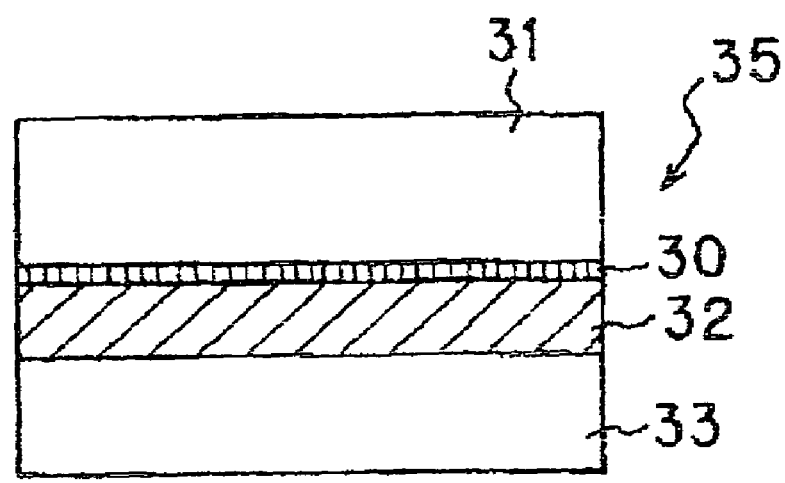
Figure 8C:
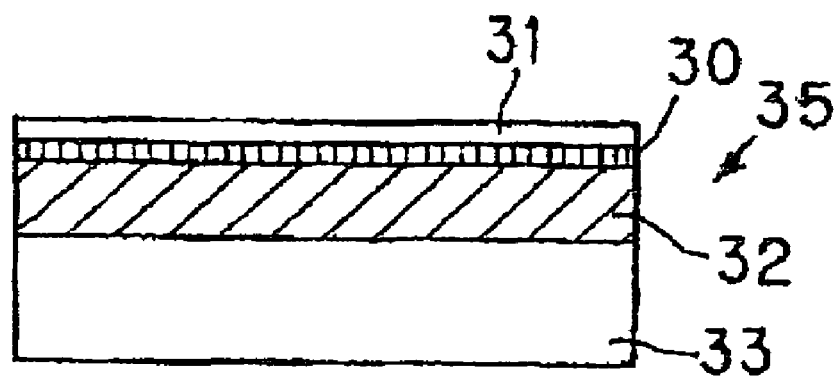

As shown in FIG. 8A, a first substrate 31 in which an insulating film 30 is formed on a surface thereof, and a second substrate 33 in which a polysilicon layer 32 is formed on a surface thereof. As shown in FIG. 8B, the first substrate 31 and the second substrate 33 are bonded together so that the insulating film 30 and the polysilicon layer 32 come into contact with each other, thereby forming a substrate 35 with a laminated structure. Furthermore, as shown in FIG. 8C, the surface of the first substrate 31 which abuts on the insulating film 30 in this substrate 35 is ground to form the first substrate 31 into a thin-film.

Figure 8D:
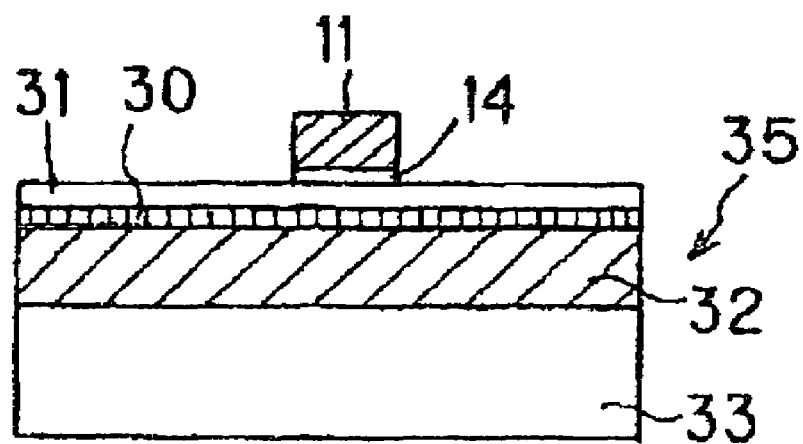

Subsequently, as shown in FIG. 8D, a region in which a cavity should be formed later is defined by forming a first gate insulating film 14 and a first gate electrode 11 on a surface of the thin film 31. The gate insulating film 14 and the gate electrode 11 may be respectively formed according to known methods.

Figure 8E:
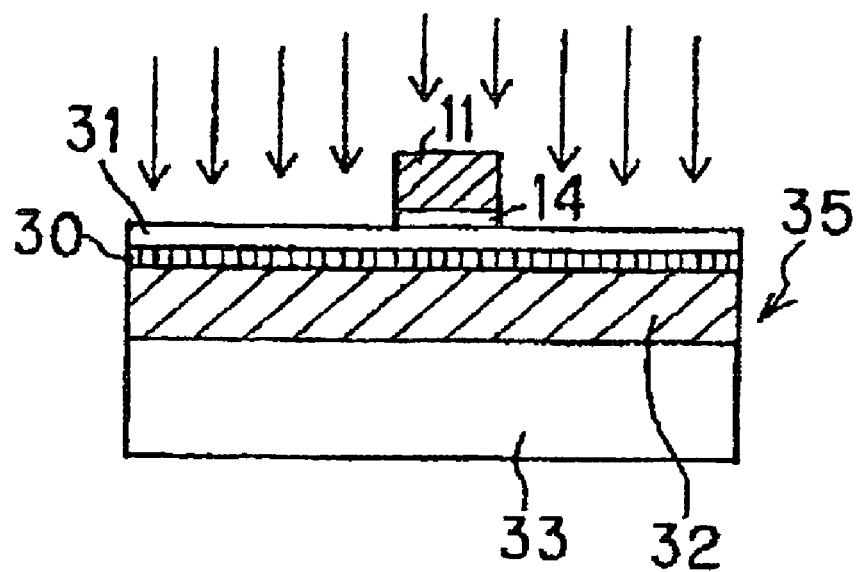

Thereafter, as shown in FIG. 8E, by implanting ions into the whole substrate 35 making the gate electrode 11 as a mask, the ions are implanted only into a specific region of the polysilicon layer 32 self-aligned to the gate electrode 11, and a number of micro-cavities are formed in the specific region. The ions are not implanted into a region under the gate electrode 11, because the gate electrode 11 acts as the mask. Thus, the micro-cavities are not formed in the region under the gate electrode 11. Accordingly, a number of the micro-cavities are selectively formed only in the specific region of the polysilicon layer 32 self-aligned to the gate electrode 11.

Figure 8F:
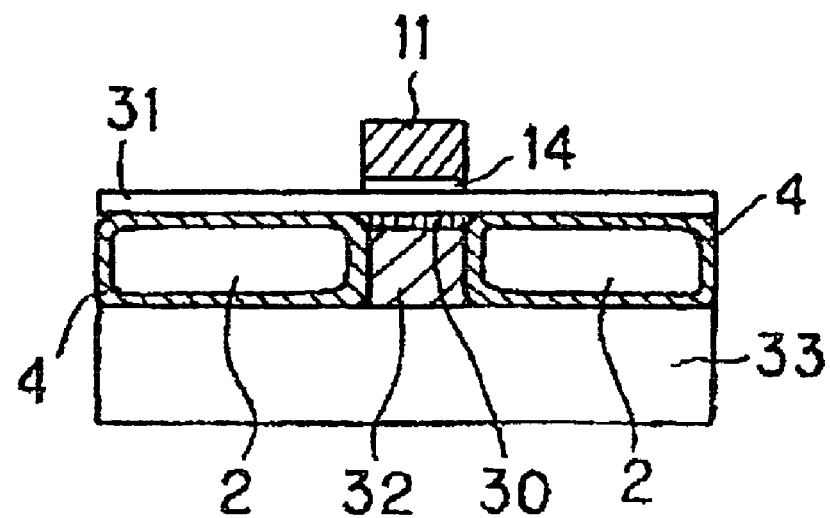

Moreover, with reference to FIG. 3C to FIG. 3F, the aforementioned heat treatment is carried out to thereby allow growth and combination of a number of the micro-cavities which have been selectively formed only in the specific region of the polysilicon layer 32 self-aligning to the gate electrode 11 to selectively form an approximately flat-shaped cavity 2 which is approximately parallel to a substrate surface and self-aligning to the gate electrode 11, and of which inside surface is further coated with an oxide film 4, in the specified region of the polysilicon layer 32, followed by manufacturing of an SON semiconductor substrate 35 shown in FIG. 8F.

Figure 8G:
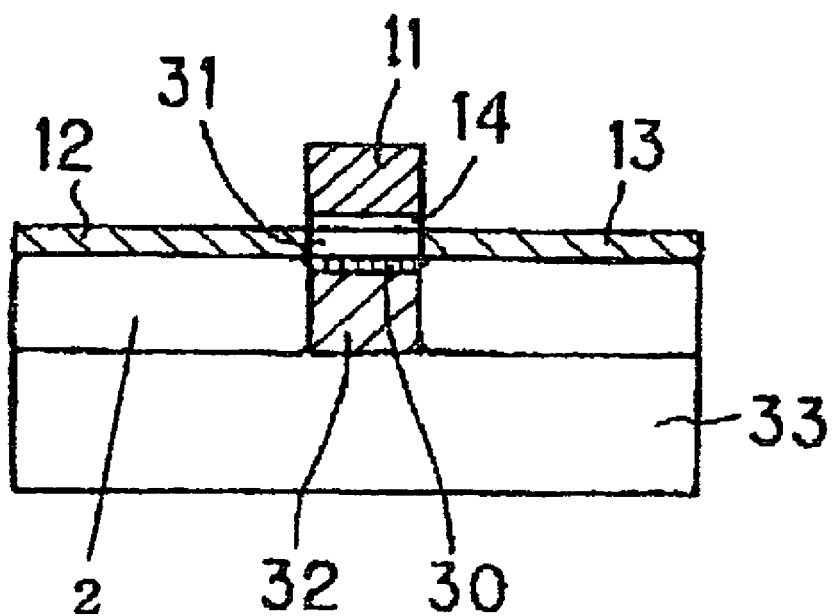

A field-effect transistor shown in FIG. 8G is then formed above the cavities 2 which has been formed within the SON semiconductor substrate 35 and self-aligned to the gate electrode 11. A source region 12 and a drain region 13, as well as a channel region 31 of the field-effect transistor are formed in the first substrate 31 which has been formed into a thin film. The source region 12 and the drain region 13, as well as the channel region 31 may be respectively formed according to known methods. Here, lower portions of the source region 12 and the drain region 13 abut on upper portions of the cavities 2.

According to this method, the polysilicon layer 32 remaining under the gate electrode 11 acts as a second gate electrode, and the insulating film 30 plays a role of a second gate insulating film.

According to this method, the semiconductor device is designed to have the cavity 2 excellent in insulation characteristics, so that leakage current can be minimized, thus providing further decreased electrical power consumption and further enhanced high-speed operating characteristics of the semiconductor device.

Furthermore, the lower portions of the source region 12 and the drain region 13 abut on the upper portions of the cavities 2. Hence, parasitic capacitance caused by p-n junction which the source region 12 and the drain region 13 have is reduced, providing further enhanced high-speed operating characteristics of the field-effect transistor.

This method makes it possible to form the cavities 2 self-aligning to both of the first gate electrode 11 and a second gate electrode 32. This method requires neither use of a mask M exclusively for ion implantation in the method of manufacturing a semiconductor substrate of the present invention nor further formation of STIs 20 as with said third embodiment Accordingly, it is possible to use the SON semiconductor substrate to easily and precisely manufacture the semiconductor device having excellent element characteristics and circuit characteristics.

Note that, in the method of manufacturing a semiconductor device according to the present fifth embodiment, the gate insulating film 14 and the gate electrode 11 are formed before carrying out an ion implantation process and the subsequent heat treatment process. However, in addition to the gate insulating film 14 and the gate electrode 11, side walls not shown may be further formed on both sides of the gate electrode 11, before carrying out the ion implantation process and the subsequent heat treatment process. In this case, the cavities 2 self-align to the side-walls not shown.

Moreover, in the method of manufacturing a semiconductor device according to the present embodiment, during at least the last period of time in a high-temperature heat treatment process, the high-temperature heat treatment is carried out in oxygen atmosphere to thereby form the oxide film 4 coating inside surfaces of the cavities 2. However, an SOI semiconductor substrate whose inner space of the cavity 2 is filled with the oxide film may be manufactured to form a semiconductor device on the SOI semiconductor substrate as shown in FIG. 3G, by increasing oxygen content in the oxygen atmosphere, or oxygen concentration in the oxygen atmosphere. Alternatively, an SON semiconductor substrate with no oxide film found in the cavity 2, as shown in FIG. 3E may be manufactured to form a semiconductor device on the SOI semiconductor substrate by carrying out the high-temperature heat treatment in oxygen poor atmosphere or in oxygen absent atmosphere.

Sixth Embodiment

Figure 9A:
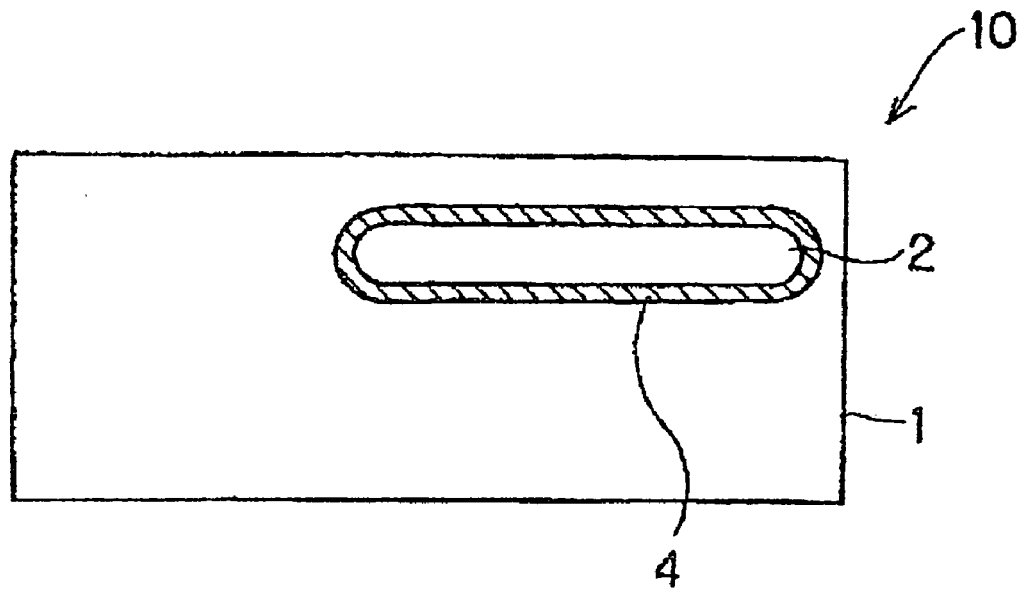
FIG. 9A and FIG. 9B are partial longitudinal sectional views showing a semiconductor device in a process included in a method of manufacturing a semiconductor device according to a sixth embodiment of the present invention.
Figure 9B:
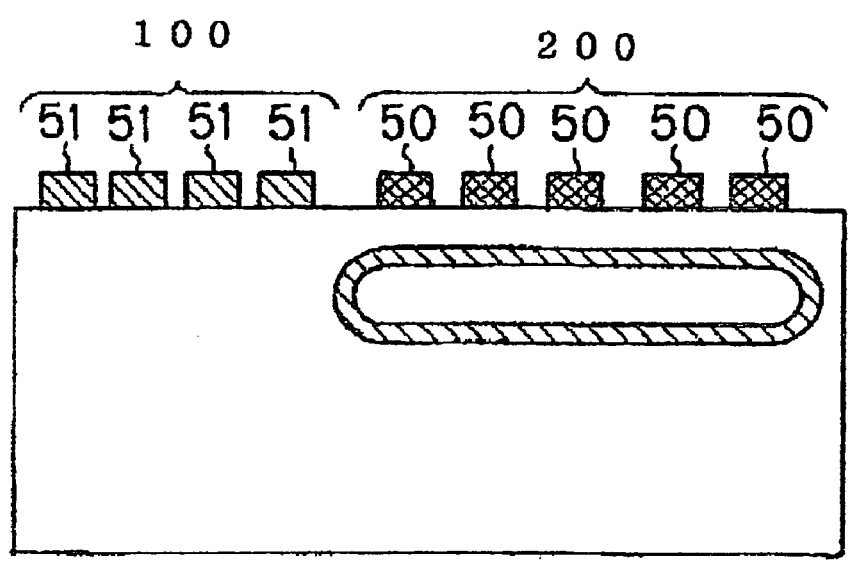

FIG. 9A and FIG. 9B are partial longitudinal sectional views showing a semiconductor device in a process included in the method of manufacturing a semiconductor device according to a sixth embodiment of the present invention.

The method of manufacturing a semiconductor device according to the sixth embodiment shown in FIG. 9A and FIG. 9B involves formation of a single combined cavity spread over a part of a plurality of regions on a semiconductor substrate, and formation of a plurality of semiconductor devices in a region above the cavity. More specifically, in the aforementioned embodiments, one combined cavity has been formed for each semiconductor device. However, in the case where a plurality of semiconductor devices are formed in a certain specific region in a semiconductor substrate, and the plurality of the respective semiconductor devices all require cavities, there is not always have to provide an individual cavity for each of the plurality of the semiconductor devices, and thus one common cavity for the plurality of the semiconductor devices may be formed in the specific region. For example, in the case where a semiconductor substrate includes a plurality of different circuit blocks, one cavity is formed which spreads over a specific circuit block requiring a cavity. More specifically, one common cavity for a plurality of circuit elements which is formed in the specific circuit block is formed.

The present sixth embodiment is an example in which the method of manufacturing the aforementioned semiconductor substrate is applied to the system LSI usually called SOC (Silicon on a chip). In the System LSI usually called SOC, a circuit area having a plurality of different functions are mixed on the same substrate. On this occasion, a first type of the circuit area of which performance improvement is expected by use of an SON structure or an SOI structure, and a second type of the circuit area which shows better characteristics when being formed on a normal Si substrate are sometimes mixed. In this case, one cavity which spreads over only the first type circuit area is formed. Here, the one cavity becomes common to the plurality of the circuit elements formed in the first type circuit area. Take, for example, when the system LSI includes a DRAM area 100 and a LOGIC area 200, concrete description will be given with reference of FIG. 9A and FIG. 9B, below. The LOGIC area 200 is equivalent to the first type circuit area of which performance improvement is expected by use of the SON structure or the SOI structure, whereas the DRAM area 100 is equivalent to the second type circuit area which shows better characteristics when being formed on the normal Si substrate.

As shown in FIG. 9A, ions are selectively implanted only into a predetermined region on a substrate 1 to thereby form a number of micro-cavities only in the predetermined region. The predetermined region will become the LOGIC area 200 later. The method of selectively implanting ions may be achieved by known methods. For example, ions may be selectively implanted only into the predetermined region through a mask exclusively for ion implantation.

Subsequently, with reference to FIG. 3C to FIG. 3F, the aforementioned heat treatment is carried out to thereby allow growth and combination of a number of the micro-cavities selectively formed only in the predetermined region to selectively form an approximately flat-shaped cavity 2 which is approximately parallel to a substrate surface, and of which inside surface is coated with an oxide film 4, in the predetermined region, followed by manufacturing of an SON semiconductor substrate 10 shown in FIG. 9A.

Thereafter, as shown in FIG. 9B, an SOC can be obtained which loads a LOGIC circuit and a DRAM together by forming the LOGIC circuit including a plurality of the LOGIC circuit elements 50 on the LOGIC area 200 above the cavity 2, as well as forming the DRAM including a plurality of DRAM constituent elements 51 on the DRAM area 100. Note that the cavity 2 is not present under the cavity. A method of manufacturing the LOGIC circuit and the DRAM may be realized by known methods. Forming the SON structure only in the LOGIC area 200 provides further enhanced high-speed operating characteristics of the LOGIC circuit. At the same time, further decreased electrical power consumption in the LOGIC circuit is realized, while the DRAM area 100 has the normal Si substrate structure, so that highly reliable DRAM with less leakage current may be obtained.

Moreover, there is little difference in Si substrate surface levels between the LOGIC area 200 with the SON structure and the DRAM area without the SON structure. Hence, it is further advantage that both the area 100 and the area 200 come into focus even if depth of focus in exposure is shallow with regard to a lithography process.

Furthermore, in the method of manufacturing a semiconductor device according to the present embodiment, during at least the last period of time in a high-temperature heat treatment process, the high-temperature heat treatment is carried out in oxygen atmosphere to thereby form the oxide film 4 coating the inside surface of the cavity 2. However, an SOI semiconductor substrate whose inner space of the cavity 2 is filled with the oxide film may be manufactured to form a semiconductor device on the SOI semiconductor substrate as shown in FIG. 3G, by increasing oxygen content in the oxygen atmosphere, or oxygen concentration in the oxygen atmosphere. Alternatively, an SON semiconductor substrate with no oxide film found in the cavity 2, as shown in FIG. 3E may be manufactured to form a semiconductor device on the SON semiconductor substrate by carrying out the high-temperature heat treatment in oxygen poor atmosphere or in oxygen absent atmosphere.

[3] Semiconductor Substrate

Figure 10:
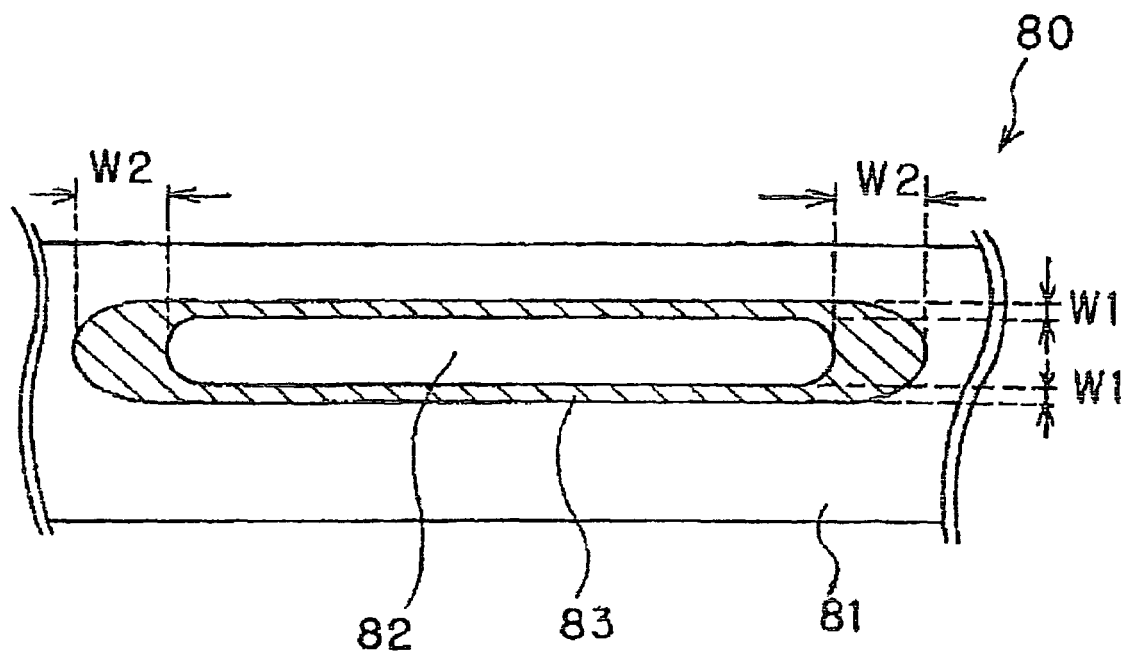
FIG. 10 is a partial longitudinal sectional view showing a novel structure of an SON semiconductor substrate according to the present invention.
Figure 11:
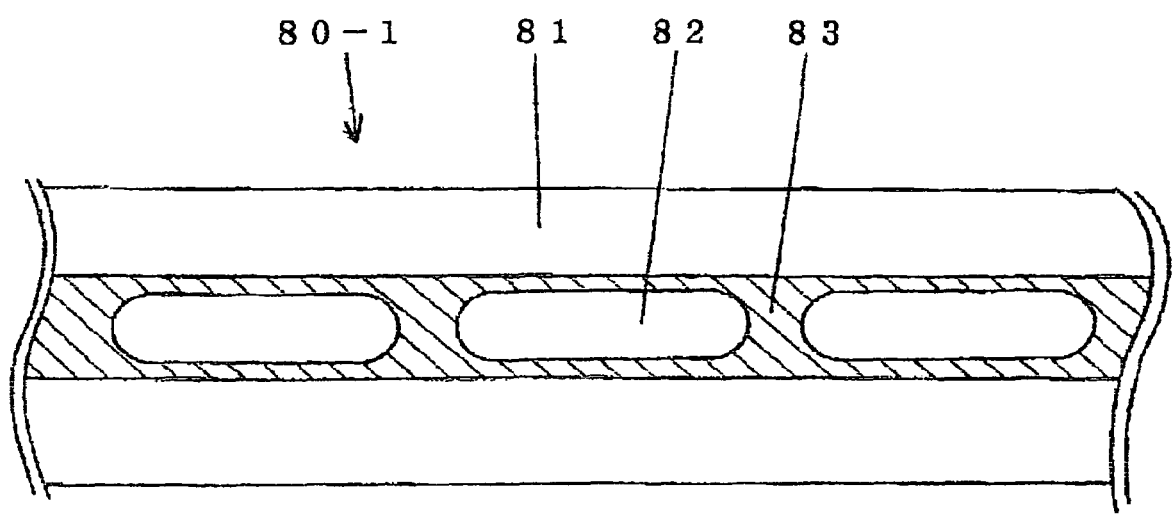
FIG. 11 is a partial longitudinal sectional view showing another novel structure of an SON semiconductor substrate according to the present invention.
Figure 12:
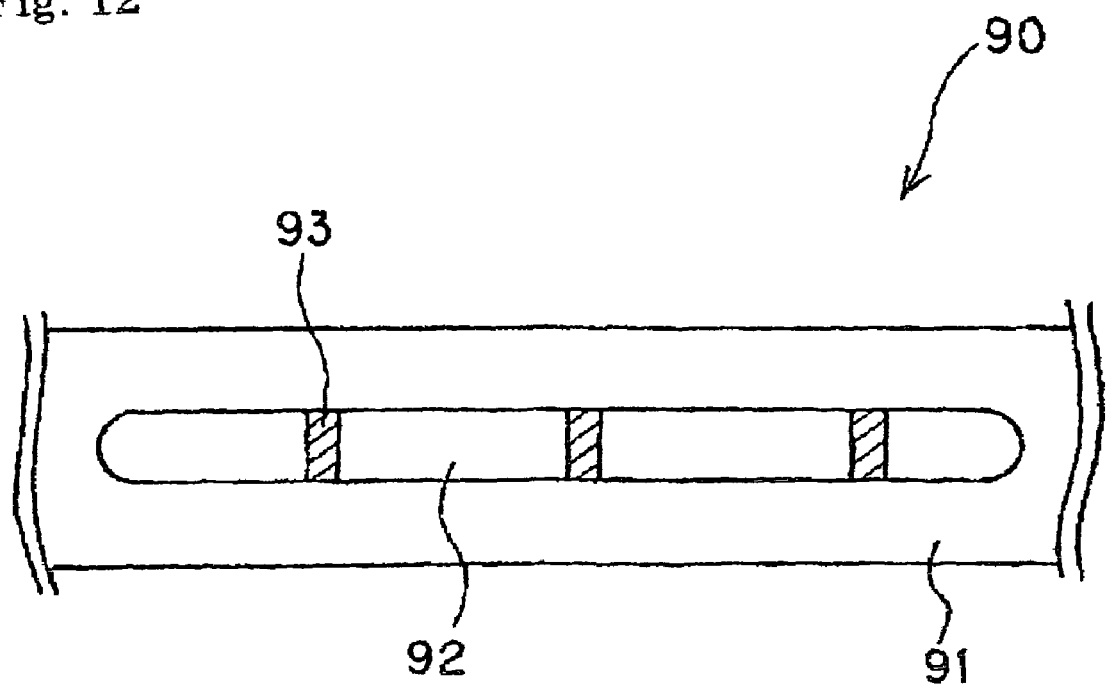
FIG. 12 is a partial longitudinal sectional view showing still another novel structure of an SON semiconductor substrate according to the present invention.

Next, detailed description will be given of the novel structure of an SON semiconductor substrate according to the present invention using the drawings. FIG. 10 is a partial longitudinal sectional view showing a novel structure of an SON semiconductor substrate according to the present invention. FIG. 11 is a partial longitudinal sectional view showing another novel structure of the SON semiconductor substrate according to the present invention. FIG. 12 is a partial longitudinal sectional view showing still another novel structure of the SON semiconductor substrate according to the present invention.

All the SON semiconductor substrates shown in FIG. 10, FIG. 11, and FIG. 12 may be obtained by applying the method of manufacturing the semiconductor device of the present invention described above. In an ion implantation process in the first step, conditions of the ion implantation such as ionic species, acceleration voltage, and dose are adjusted. Further, in a heat treatment process in the second step, it is necessary to adjust conditions of heat treatment such as heat treatment atmosphere, temperature, rate of temperature increase, and time.

A semiconductor substrate 80 shown in FIG. 10 is an SON semiconductor substrate having a flat-shaped cavity 82 within a substrate 81, in which an oxide film 83 is formed on an inside surface of the cavity 82. And, the oxide film 83 comprises thin portions on inside upper and lower surfaces of the cavity 82 and thick portions on inside side walls of the cavity 82. More specifically, the thin portions of the oxide film 83 extend in a direction approximately perpendicular to a thickness direction of the substrate 81, whereas the thick portions of the oxide film 83 extend in a direction approximately parallel to the thickness direction of the substrate 81. The respective thin portions of the oxide film 83 have respective first thicknesses W1, whereas the respective thick portions of the oxide film 83 have respective second thicknesses W2 thicker than the respective first thicknesses W1. In other words, the conditions of the ion implantation in the ion implantation process in the first step and the conditions of the heat treatment in the heat treatment process in the second step are adjusted so that the film thicknesses of the oxide film 83 are reduced on the inside upper and lower surfaces of the cavity 82, whereas the film thicknesses of the oxide film 83 are increased on the inside side walls of the cavity 82. By doing this, it is possible to lower dielectric constant, as well as to avoid formation of a surface state within the substrate. The first thicknesses W1 of the thin portions of the oxide film 83 and the second thicknesses W2 of the thick portions of the oxide film 83 are good enough to meet a relationship of W1<W2, and thus further limitation is not necessarily required. However, in order to avoid the formation of the surface state within the substrate, while lowering the dielectric constant, it is preferable that the first thicknesses W1 and the second thicknesses W2 be, for example, in the range of 1 nm to 50 nm, and 100 nm to 300 nm, respectively.

Oxygen atoms contained in oxygen atmosphere in said high-temperature heat treatment include: ones which are introduced into the cavity 82 from a surface of the substrate 81, and ones which are introduced within a range of a depth approximately identical with the range of the depth, from the surface of the substrate 81 to inside of the substrate 81, at which the cavity 82 is formed the substrate 81. More specifically, the conditions of the high-temperature heat treatment in the oxygen atmosphere are adjusted so that the depth at which the oxygen atoms contained in the oxygen atmosphere are introduced into the substrate 81 is set within the range of the depth at which the cavity 82 is formed, preferably, in the vicinity of a intermediate level in the range of the depth. This causes the oxygen introduced into inner space of the cavity 82 to oxidize the inside upper and lower surfaces of the cavity 82. In contrast with this, in addition to the oxygen introduced into the inner space of the cavity 82, the side walls of the cavity 82 are oxidized even by the oxygen introduced into the vicinity of the side walls of the cavity 82 within the substrate 81, so that the thicknesses of the oxide film 83 which are formed on the side walls of the cavity 82 are thicker than the film thicknesses of the oxide film 83 are formed on the inside upper and lower surfaces of the cavity 82. And, the thick portions of the oxide film 83 which are formed on the side walls of the cavity 82 are thickest in the vicinity of the intermediate level in the range of the depth at which the cavity 82 is formed.

The oxide film 83 is being thinly formed on the inside upper and lower surfaces of the cavity 82, so that the dielectric constant may be reduced more than that of the semiconductor substrate in which the oxide film is being thickly formed on the inside upper and lower surfaces of the cavity 82. Particularly, the oxide film 83 is preferably formed to a degree to which the surface state is not formed on the inside upper and lower surfaces of the cavity 82. Furthermore, the oxide film 83 is thick in a portion of extending in the direction approximately parallel to the thickness direction of the substrate 81. This provides improved durability against mechanical strength and mechanical stress in the thickness direction of the substrate 81, thereby making it possible to keep a shape of the cavity 82 with high accuracy.

Additionally, as shown in FIG. 11, it is possible that a plurality of the cavities 82 are spaced at predetermined intervals to form, an SON semiconductor substrate 80-1 formed in the substrate 81 in the range of the same depth. In this case, the conditions of the high-temperature heat treatment in said oxygen atmosphere is adjusted, whereby insulating regions may be formed in the substrate by a plurality of the cavities 82 separated with each other by the thick portions of the oxide film 83. In this case, the thick portions of the film thickness of the oxide film 83 which separate a plurality of the cavities 82 with each other are equivalent to the thick portions of the oxide film 83 which is formed on the side walls of said cavity 82 shown in the aforementioned FIG. 10. Here, the thick portions of the oxide film 83 which separate a plurality of the cavities 82 with each other comprise barriers whose film thicknesses vary with depth levels. As shown in FIG. 11, the film thicknesses are minimal at an intermediate depth level of the cavity 82, and gradually increase as closer to the depth level of the inside top face and the depth level of the inside under face.

In general, in the case where the SON substrate having cavity within the substrate 81 is manufactured, it becomes difficult to keep the shape of the cavity 82 and high flatness of a substrate surface positioned above the cavity 82, as size of the cavity 82 in a horizontal direction parallel to the surface of the substrate 81 is enlarged. Namely, the mechanical strength and dividing of the substrate 81, and the mechanical strength in the thickness direction of the substrate 81 are deteriorated. However, as described above, the cavity 82 has a barrier portion comprising a part of the oxide film 83 in its inside, whereby the barrier enhances the mechanical strength and the dividing of the substrate 81, and the mechanical strength in the thickness direction of the substrate 81. Thus, presence of the barrier facilitates to keep the shape of the cavity 82 and the high flatness of the substrate surface positioned above the cavity 82, even if the size of said cavity 82 in the horizontal direction is enlarged.

Further continuation of the high-temperature heat treatment to the SON substrate shown in FIG. 11 allows deformation of the barrier portion, making it possible to render the film thickness of the barrier approximately uniform to depth level changes, as shown in FIG. 12. In other words, a semiconductor substrate 90 shown in FIG. 12 is an SON semiconductor substrate having flat-shaped cavities 92 within a substrate 91, in which an oxide film extending onto an inside surface of the cavities 92 and in inner space of the cavities 92 is formed. In FIG. 12, the oxide film extending onto the inside surfaces of the cavities 92 is not shown, and only barrier portions 93 of the oxide film extending in the inner space of the cavities 92 are shown. As described above, the film thicknesses of the respective barrier portions 93 of the oxide film are well thicker than the film thicknesses of the oxide film formed on the inside upper and lower surfaces of the cavities 92. And, the barrier portions 93 of the oxide film having thick film thicknesses extend in a direction approximately parallel to a thickness direction of the substrate 91.

As described above, in the case where the SON substrate having the cavities within the substrate 91 is manufactured, it becomes difficult to keep the shape of the respective cavities 92 and high flatness of the substrate surface positioned above the cavities 92, as the size of the respective cavities 92 in a horizontal direction parallel to a surface of the substrate 91 is enlarged. Namely, mechanical strength and dividing of the substrate 91, and the mechanical strength in the thickness direction of the substrate 91 are deteriorated. However, as described above, the cavities 92 have barrier portions comprising part of the oxide film in its inside, whereby the barrier portions 93 enhance the mechanical strength and the dividing of the substrate 91, and the mechanical strength in the thickness direction of the substrate 91. Thus, presence of the barriers 93 facilitates to keep the shape of the respective cavities 92 and the high flatness of the substrate surface positioned above the cavities 92, even if the size of the respective cavities 92 in the horizontal direction is enlarged.

As described above with reference to FIG. 11, the oxide film formed in the cavities 82 extends in the film thickness direction of the substrate 81, besides portions formed on the inside surface of the cavities 82, and has barrier portions 83 with thick film thicknesses. As a modified example of the structure shown in FIG. 11, the barrier portions 83 may be replaced by column portions. Alternatively, as a modified example of the structure shown in FIG. 12, the barrier portions 93 may be replaced by the column portions.

The oxide film comprising a portion in which the inside surfaces of said cavities are coated and a plurality of column portions which are present in the cavities may be formed by dotting a plurality of island-shaped regions in which ions are not implanted, in a predetermined region for the purpose of forming a cavity, and further adjusting said conditions of the ion implantation and conditions of the high-temperature heat treatment in said oxygen atmosphere. A plurality of the column portions are formed in a plurality of the island-shaped regions. In this case, the thick portions of the film thickness of the oxide film which separate said plurality of the cavities 82 with each other shown in FIG. 11 are equivalent to the columnar portions of the oxide film which are formed in said cavities. Here, the columnar portion of the oxide film comprises a column with, size of its lateral direction, that is, a diameter varying depending on the depth level. In other words, the diameter is minimal at the intermediate depth level of said cavities, and is gradually increased as closer to the depth level of the inside top faces of said cavities and the depth level of the inside under faces. Furthermore, as described above with reference to FIG. 12, further continuation of the high-temperature heat treatment to the substrate allows the deformation of the columnar portions of the oxide film, making it possible to be the column whose diameter is approximately uniform to depth level changes.

[4] Semiconductor Device

Next, detailed description will be given of the novel structure of a semiconductor device of the present invention using the drawings.

Figure 13:
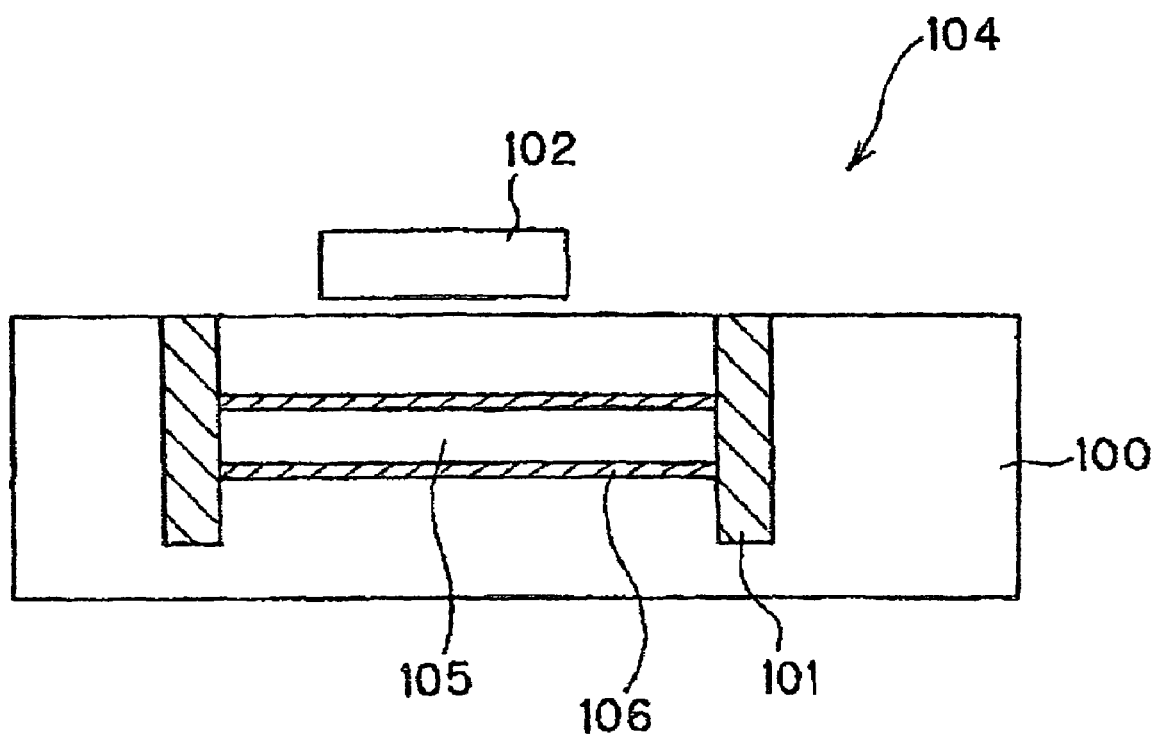
FIG. 13 is a partial longitudinal sectional view showing a novel structure of a semiconductor device of the present invention.

FIG. 13 is a partial longitudinal sectional view showing a novel structure of a semiconductor device of the present invention. A semiconductor device element 102 is formed in a region divided by an element isolation insulating film 101 of a semiconductor substrate, providing a semiconductor device 104. An approximately flat-shaped cavity 105 is formed at an approximately certain depth from a surface within the substrate in the region divided by said element isolation insulating film 101, and the cavity 105 is terminated on its side surfaces by the element isolation insulating film 101. More specifically, the cavity 105 self-aligns to the element isolation insulating film 101. The element isolation insulating film 101 can be composed of, for example, Shallow Trench Isolation. And, an oxide film 106 coating an inside surface of the cavity 105 is formed.

The semiconductor device of the present invention self-aligns to the element isolation insulating region, as well as may be manufactured by the method of manufacturing a semiconductor device applying the method of manufacturing a semiconductor substrate whose inside surface is coated with an oxide film, which has been described earlier with reference to FIG. 6A to FIG. 6D.

EXAMPLES

Hereinafter, the method of manufacturing a semiconductor substrate, and the method of manufacturing a semiconductor device will be more specifically described according to examples.

Example 1

Example 1 is an example of the method of manufacturing a semiconductor substrate of the present invention.

A silicon substrate was used as a substrate, and helium was used as ions used in the first step. Acceleration voltage was made 45 keV, and dose $4 \times 10^{17}/cm^2$ as conditions of helium ion implantation in the first step.

Additionally, as conditions of heat treatment in the second step, heat treatment atmosphere was made Ar atmosphere containing 0.5% of $O_2$. Low-temperature heat treatment was carried out at 400° C. to 600° C. for two hours, then middle-temperature heat treatment was carried out at 800° C. to 1000° C. for two hours, and further high-temperature heat treatment was carried out for five hours at a temperature of 1350° C. increased from 1200° C. at a slow rate of temperature increase of 0.02° C./min.

In Example 1 the following results and the following SON semiconductor substrate were obtained.

Figure 14:
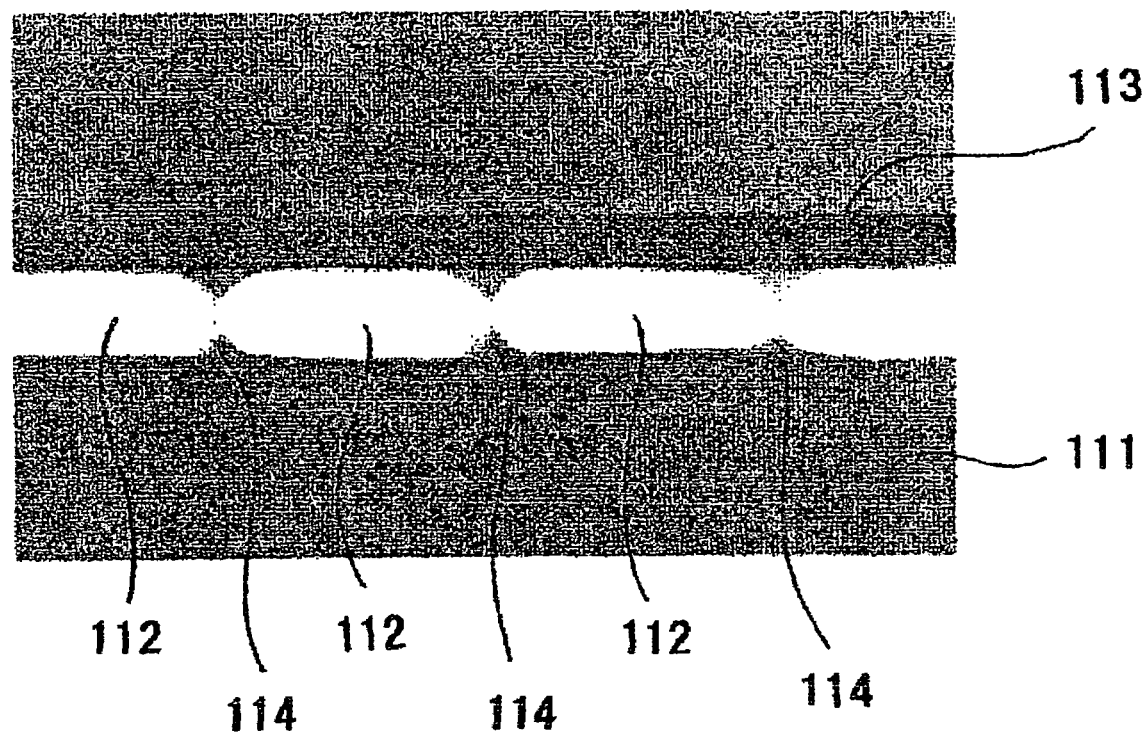
FIG. 14 is a partial longitudinal sectional photograph of a semiconductor substrate manufactured in Example 1.

(1) FIG. 14 is a partial longitudinal sectional photograph of a semiconductor substrate manufactured in Example 1. Cavities 112 are formed in a silicon substrate 111, and inside upper and lower surfaces 113 of the cavities 112 are coated with oxide films 114. Size of the respective cavities 112 in a horizontal direction of the cavities 112 and thicknesses of the oxide films 114 were adjusted to form the oxide films 114 so as to include column portions which support the cavities 112. It was confirmed that a semiconductor substrate with a structure shown in FIG. 11 is manufactured, though being not apparently shown in FIG. 14.

(2) As a result of observation of changes in an inner structure of a substrate over each stage of the low-temperature heat treatment, the middle-temperature heat treatment, and the high-temperature heat treatment by Transmission Electron Microscope (TEM), it was possible to confirm the changes in the inner structure of the semiconductor substrate as shown in FIG. 3C to FIG. 3F.

(3) As shown in FIG. 13, it was confirmed that the cavities which have been finally formed within the substrate have uniform size as large as about 100 nm in height thereof, that is, in a thickness direction of the substrate, and has the same size in a direction parallel to width thereof, that is, the substrate surface as the region into which ions were implanted in the first step.

(4) It was further confirmed that a thin oxide film with a thickness of about 5 nm was formed when the inside surface of this cavity was closely objected.

Example 2

Example 2 is another example of the method of manufacturing a semiconductor substrate of the present invention.

A silicon substrate was used as a substrate, and helium was used as ions used in the first step. Acceleration voltage was made 45 keV, and dose $4\times10^{17}/cm^2$ as conditions of helium ion implantation in the first step.

Additionally, as conditions of heat treatment in the second step, heat treatment atmosphere was made oxygen atmosphere containing $O_2$. Low-temperature heat treatment was carried out at 400° C. to 600° C. for two hours, then middle-temperature heat treatment was carried out at 800° C. to 1000° C. for two hours, and further high-temperature heat treatment was carried out for four hours at a temperature of 1350° C. increased from 1200° C. at a slow rate of temperature increase of 0.2° C./min.

In Example 2, the following results and the following SOI semiconductor substrate were obtained.

(1) As a result of observation of changes in an inner structure of a substrate in each stage of the low-temperature heat treatment, the middle-temperature heat treatment, and the high-temperature heat treatment by Transmission Electron Microscope (TEM), it was possible to confirm the changes in the inner structure of the substrate shown in FIG. 3C to FIG. 3G, that is, a partial SOI structure whose cavity inside is filled with an oxide film.

(2) It was confirmed that the cavities which have been finally formed within the substrate have uniform size as large as about 200 nm in height thereof, that is, in a thickness direction of the substrate, and has the same size in a direction parallel to width thereof, that is, the substrate surface as the region into which ions were implanted in the first step.

Example 3

According to the same conditions as conditions of ion implantation and conditions of heat treatment shown in said Example 1, substrates having various cavities were made, with which the semiconductor device shown in said First Embodiment illustrated in FIG. 4A to FIG. 4B, the semiconductor device shown in said Second Embodiment illustrated in FIG. 5A to FIG. 5B, the semiconductor device shown in said Third Embodiment illustrated in FIG. 6A to FIG. 6D, the semiconductor device shown in said Fourth Embodiment illustrated in FIG. 7A to FIG. 7D, the semiconductor device shown in said Fifth Embodiment illustrated in FIG. 8A to FIG. 8G, and the semiconductor device shown in said Sixth Embodiment illustrated in FIG. 9A to FIG. 9B were manufactured. Note that semiconductor device elements such as gate electrode, source electrode and drain electrode were respectively formed according to conventionally known methods.

It was confirmed that all the manufactured semiconductor devices have cavities excellent insulation characteristics in a predetermined region of the semiconductor substrate, thus enabling reduced leakage current more than that of conventional semiconductor devices, with lower electrical power consumption and higher speed operating characteristics.

INDUSTRIAL APPLICABILITY

As has been described hereinbefore, according to the method of manufacturing a semiconductor substrate of the present invention, carrying out the first step of implanting ions allows formation of the micro-cavities in the predetermined of the substrate. Further, carrying out the second step of giving the heat treatment to the substrate allows growth and combination of the micro-cavities formed in the substrate in said first step to form the SON semiconductor substrate having a flat-shaped cavity approximately parallel to the substrate surface.

Furthermore, according to the present invention, the high-temperature heat treatment step is carried out for exposing the substrate to the temperature of not less than 1000° C., and therefore the substrate itself is softened by being exposed to the high temperature at the same time as that the micro-cavities formed in the first step grow and combine with each other. As a result, even if the substrate surface is elevated in a portion in which the cavity is formed in a moment when the cavity is formed within the substrate, the substrate surface can return to flatness at once (the elevated portion being smoothed), so that the SON substrate may be manufactured while keeping the flatness of the substrate surface.

In addition, according to the method of manufacturing a semiconductor device of the present invention, leakage current may be reduced more than that of conventional semiconductor devices, and thus the semiconductor device with lower electrical power consumption and higher speed operating characteristics may be easily and inexpensively manufactured.

Moreover, the semiconductor substrate and the semiconductor device of the present invention have realized lower electrical consumption and higher speed operating characteristics.

Having described the present invention in relation to some preferred embodiments and examples, it is to be understood that these embodiments and examples are merely for illustrative purposes of the invention with examples and not restrictive. It will be obvious that upon reading the specification, many changes and substitutions may be made easily by components or technologies equal to those skilled in the art, but that such changes and substitutions fall within the scope and spirit as set out in the appended claims.

What is claimed is:

1. A method of manufacturing a semiconductor substrate, comprising:
   selectively implanting ions into a predetermined region in a substrate, the implanted ions, in turn, forming a plurality of micro-cavities in said predetermined region; and
   giving heat treatment to the substrate, thereby, after discharge of said implanted ions outside of said substrate as gas, allowing growth of said plurality of respective micro-cavities and further combination of adjacent micro-cavities with each other to form an embedded insulating region comprising a combined cavity present all over said predetermined region, and coating of a portion of an inside surface of said cavity within said embedded insulating region with a film.

2. The method of manufacturing a semiconductor substrate according to claim 1, wherein said combined cavity includes a seamlessly uninterrupted inside surface, and includes an inner space completely closed from outside of said substrate by the inside surface.

3. The method of manufacturing a semiconductor substrate according to claim 1, wherein said giving heat treatment allows said substrate to soften due to inclusion of high-temperature heat treatment carried out in a high temperature range of not less than 1000° C., and
   even if a surface of a substrate corresponding to a region in which said cavity is formed is elevated, in a moment when said cavity is formed within said substrate, allows the surface of the substrate to be returned to flatness at once, so that the surface of said substrate which is finally obtained is flat, and an interface between an upper portion of said cavity and said substrate is parallel and flat to a flat surface of said substrate.

4. The method of manufacturing a semiconductor substrate according to claim 1, wherein said giving heat treatment includes high-temperature heat treatment, and the high-temperature heat treatment allowing adjacent micro-cavities to be combined with each other to form a combined cavity present all over said predetermined region.

5. The method of manufacturing a semiconductor substrate according to claim 4, wherein said high-temperature heat treatment is carried out in a high-temperature range of not less than 1000° C.

6. The method of manufacturing a semiconductor substrate according to claim 5, wherein in said giving heat treatment a process of discharging said implanted ions outside of said substrate as gas comprises low-temperature heat treatment carried out in a low-temperature range of not less than 400° C. through less than 700° C., before said high-temperature heat treatment.

7. The method of manufacturing a semiconductor substrate according to claim 5, wherein said giving heat treatment further includes middle-temperature heat treatment carried out in a middle-temperature region of not less than 700° C. through less than 1000° C. in order to allow growth of said plurality of respective micro-cavities.

8. The method of manufacturing a semiconductor substrate according to claim 5, wherein said giving heat treatment further includes low-temperature heat treatment carried out in a low-temperature region of not less than 400° C. through less than 700° C. in order to discharge said implanted ions outside of said substrate as gas, and middle-temperature heat treatment carried out in a middle-temperature region of not less than 700° C. through less than 1000° C. in order to allow growth of said plurality of respective micro-cavities, before said high-temperature heat treatment.

9. The method of manufacturing a semiconductor substrate according to claim 8, wherein said low-temperature heat treatment is carried out at not less than 400° C. through less than 600° C., said middle-temperature heat treatment is carried out at not less than 800° C. through less than 1000° C., and said high-temperature heat treatment is carried out at a temperature increased further from 1200° C.

10. The method of manufacturing a semiconductor substrate according to claim 4, wherein said film comprises an oxide film at least coating said inside surface which completely closes an inner space of said cavity is formed by carrying out at least said high-temperature heat treatment in oxygen rich atmosphere.

11. The method of manufacturing a semiconductor substrate according to claim 10, wherein said oxide film includes a thicker film thickness in a portion, formed on side walls of said cavity than in a portion, formed on inside upper and lower surfaces of said cavity.

12. The method of manufacturing a semiconductor substrate according to claim 11, wherein said oxide film coats an inside surface of said cavity, and includes at least one columnar portion formed in inner space of said cavity.

13. The method of manufacturing a semiconductor substrate according to claim 11, wherein said oxide film coats an inside surface of said cavity, and includes at least one barrier-structure portion which is formed in inner space of said cavity.

14. The method of manufacturing a semiconductor substrate according to claim 10, wherein said high-temperature heat treatment is carried out in said oxygen rich atmosphere until said oxide film fills up inner space of said cavity.

15. The method of manufacturing a semiconductor substrate according to claim 10, wherein oxygen rich atmosphere is utilized only during the last certain period of time of a period in which said high-temperature heat treatment is carried out.

16. The method of manufacturing a semiconductor substrate according to claim 10, wherein said giving heat treatment further includes a process of removing a surface oxide film formed on a surface of said substrate after said high-temperature heat treatment by carrying out said high-temperature heat treatment in said oxygen rich atmosphere.

17. The method of manufacturing a semiconductor substrate according to claim 10, further comprising:
forming said oxide film coating an inner surface of said cavity, forming at least one communication hole that communicates said cavity with outside of said substrate on said substrate, and forming at least one insulating film different from an oxide film on a surface of said oxide film through the at least one communication hole.

18. The method of manufacturing a semiconductor substrate according to claim 4, wherein after said cavity is formed, at least one communication hole that communicates said cavity with outside of said substrate is further formed on said substrate to form an insulating film comprising at least one layer structure coating at least an inside surface of said cavity through the at least one communication hole.

19. The method of manufacturing a semiconductor substrate according to claim 1, wherein said ions are at least one ion selected from the group consisting of hydrogen ion, helium ion, neon ion, and fluorine ion.

20. The method of manufacturing a semiconductor substrate according to claim 19, wherein in said selectively implanting, said ion implantation is carried out at room temperature.

21. The method of manufacturing a semiconductor substrate according to claim 19, wherein in said selectively implanting, said ion implantation is carried out at a temperature higher than room temperature.

22. The method of manufacturing a semiconductor substrate according to claim 1, wherein in said selectively implanting, a mask exclusively for ion implantation is used to selectively implant said ions only into a predetermined region of said substrate.

23. The method of manufacturing a semiconductor substrate according to claim 1, wherein in said selectively implanting, at least one electrode is formed on said substrate, said at least one electrode being used as a mask to selectively implant said ions only into a predetermined region of said substrate, whereby in said giving heat treatment, said cavity self-aligning to said at least one electrode is formed.

24. The method of manufacturing a semiconductor substrate according to claim 1, wherein in said selectively implanting, at least one isolation region is formed on an upper portion region of said substrate, and said at least one isolation region being used as a mask to selectively implant said ions only into a predetermined region of said substrate, whereby in said giving heat treatment, said cavity self-aligning to said at least one isolation region is formed.

25. The method of manufacturing a semiconductor substrate according to claim 1, wherein said predetermined region extends over a single semiconductor device element forming region of said substrate, whereby an embedded insulating region comprising said cavity extends over said semiconductor device element forming region.

26. The method of manufacturing a semiconductor substrate according to claim 1, wherein said predetermined region extends over a single circuit block forming region of said substrate, whereby an embedded insulating region comprising said cavity extends over said circuit block forming region.

27. The method of manufacturing a semiconductor substrate according to claim 1, wherein said semiconductor substrate comprises a silicon substrate.

28. The method of manufacturing a semiconductor substrate according to claim 1, further comprising forming at least one single crystal semiconductor layer on said substrate surface, after said giving heat treatment.

29. A method of manufacturing a semiconductor substrate, comprising:
selectively implanting ions into a predetermined region in a substrate, the implanted ions, in turn, forming a plurality of micro-cavities in said predetermined region; and
giving heat treatment to said substrate, thereby, after discharge of said implanted ions outside of said substrate as gas, allowing growth of said plurality of respective micro-cavities and further combination of adjacent micro-cavities with each other to form an embedded insulating region comprising a combined cavity present all over said predetermined region,
wherein said combined cavity includes a seam lessly uninterrupted inside surface, and includes an inner space completely closed from outside of said substrate by the inside surface,
wherein heat treatment in said giving heat treatment includes high-temperature heat treatment, said high-temperature heat treatment allowing combination of adjacent micro-cavities with each other to form said combined cavity present all over said predetermined region, and
wherein an oxide film at least coating said inside surface of said cavity is formed by carrying out said high-temperature heat treatment in oxygen rich atmosphere, during at least the last certain period of time of said high-temperature heat treatment.

30. The method of manufacturing a semiconductor substrate according to claim 29, wherein heat treatment in said giving heat treatment allows said substrate to soften due to inclusion of high-temperature heat treatment carried out in a high temperature range of not less than 1000° C., and
if a surface of a substrate corresponding to a region in which said cavity is formed is elevated, in a moment when said cavity is formed within said substrate, said heat treatment allows the surface of the substrate to be returned to flatness at once, so that the surface of said substrate which is finally obtained is flat, and an interface between an upper portion of said cavity and said substrate is parallel and flat to a flat surface of said substrate.

31. The method of manufacturing a semiconductor substrate according to claim 29, wherein said high-temperature heat treatment is carried out in a high-temperature range of not less than 1000° C.

32. The method of manufacturing a semiconductor substrate according to claim 31, wherein in said giving heat treatment, a process of discharging said implanted ions outside of said substrate as gas comprises low-temperature heat treatment carried out in a low-temperature region of not less than 400° C. through less than 700° C., before said high-temperature heat treatment.

33. The method of manufacturing a semiconductor substrate according to claim 31, wherein said giving heat treatment further includes middle-temperature heat treatment carried out in a middle-temperature region of not less than 700° C. through less than 1000° C. in order to allow growth of said plurality of respective micro-cavities, before said high-temperature heat treatment.

34. The method of manufacturing a semiconductor substrate according to claim 31, wherein said giving heat treatment further includes low-temperature heat treatment carried out in a low-temperature region of not less than 400° C. through less than 700° C. in order to discharge said implanted ions outside of said substrate as gas, and middle-temperature heat treatment carried out in a middle-temperature region of not less than 700° C. through less than 1000° C. in order to allow growth of said plurality of respective micro-cavities, before said high-temperature heat treatment.

35. The method of manufacturing a semiconductor substrate according to claim 34, wherein said low-temperature heat treatment is carried out at not less than 400° C. through less than 600° C., said middle-temperature heat treatment is carried out at not less than 800° C. through less than 1000° C., and said high-temperature heat treatment is carried out at a temperature increased further from 1200° C.

36. The method of manufacturing a semiconductor substrate according to claim 29, wherein said oxide film has a film thickness in a portion which is formed on side walls of said cavity, which is greater than a film thickness in a portion which is formed on inside upper and lower surfaces of said cavity.

37. The method of manufacturing a semiconductor substrate according to claim 36, wherein said oxide film coats an inside surface of said cavity, and includes at least one columnar portion which is formed in inner space of said cavity.

38. The method of manufacturing a semiconductor substrate according to claim 36, wherein said oxide film coats an inside surface of said cavity, and includes at least one barrier-structure portion which is formed in inner space of said cavity.

39. The method of manufacturing a semiconductor substrate according to claim 29, wherein said high-temperature heat treatment is carried out in said oxygen rich atmosphere until said oxide film fills up inner space of said cavity.

40. The method of manufacturing a semiconductor substrate according to claim 29, wherein oxygen rich atmosphere is utilized only during the last certain period of time of a period in which said high-temperature heat treatment is carried out.

41. The method of manufacturing a semiconductor substrate according to claim 29, further comprising removing a surface oxide film formed on a surface of said substrate by said high-temperature heat treatment carried out in said oxygen rich atmosphere, after said high-temperature heat treatment.

42. The method of manufacturing a semiconductor substrate according to claim 29, wherein said ions are at least one ion selected from the group consisting of hydrogen ion, helium ion, neon ion, and fluorine ion.

43. The method of manufacturing a semiconductor substrate according to claim 42, wherein in said selectively implanting, said ion implantation is carried out at room temperature.

44. The method of manufacturing a semiconductor substrate according to claim 42, wherein in said selectively implanting, said ion implantation is carried out at a temperature higher than room temperature.

45. The method of manufacturing a semiconductor substrate according to claim 29, wherein in said selectively implanting, a mask exclusively for ion implantation is used to selectively implant said ions only into a predetermined region of said substrate.

46. The method of manufacturing a semiconductor substrate according to claim 29, wherein in said selectively implanting, at least one electrode is formed on said substrate, said at least one electrode being used as a mask to selectively implant said ions only into a predetermined region of said substrate, whereby in said giving heat treatment, said cavity self-aligning to said at least one electrode is formed.

47. The method of manufacturing a semiconductor substrate according to claim 29, wherein in said selectively implanting, at least one isolation region is formed on an upper portion region of said substrate, said at least one isolation region being used as a mask to selectively implant said ions only into a predetermined region of said substrate, whereby in said giving heat treatment, said cavity self-aligning to said at least one isolation region is formed.

48. The method of manufacturing a semiconductor substrate according to claim 29, wherein said predetermined region extends over a single semiconductor device element forming region of said substrate, whereby an embedded insulating region comprising said cavity extends over said semiconductor device element forming region.

49. The method of manufacturing a semiconductor substrate according to claim 29, wherein said predetermined region extends over a single circuit block forming region of said substrate, whereby an embedded insulating region comprising said cavity extends over said circuit block forming region.

50. The method of manufacturing a semiconductor substrate according to claim 29, wherein said semiconductor substrate comprises a silicon substrate.

51. The method of manufacturing a semiconductor substrate according to claim 29, further comprising forming at least one single crystal semiconductor layer on said substrate surface after said giving heat treatment.

52. A method of manufacturing a semiconductor substrate, comprising:
   selectively implanting ions into a predetermined region in a substrate, the implanted ions, in turn, forming a plurality of micro-cavities in said predetermined region; and
   giving heat treatment to the substrate, thereby, after discharge of said implanted ions outside of said substrate as gas, allowing growth of said plurality of respective micro-cavities and further combination of adjacent micro-cavities with each other to form an embedded insulating region comprising a combined cavity present all over said predetermined region,
   wherein said combined cavity includes a seamlessly uninterrupted inside surface, and includes an inner space completely closed from outside of said substrate by the inside surface,
   wherein heat treatment in said giving heat treatment includes high-temperature heat treatment, said high-temperature heat treatment allowing combination of adjacent micro-cavities with each other to form said combined cavity present all over said predetermined region, and
   wherein an oxide film filling up said inner space of said cavity is formed by carrying out said high-temperature heat treatment in oxygen rich atmosphere, during at least the last certain period of time of said high-temperature heat treatment.

53. The method of manufacturing a semiconductor substrate according to claim 52, wherein heat treatment in said giving heat treatment allows said substrate to soften due to inclusion of high-temperature heat treatment carried out in a high temperature range of not less than 1000° C., and if a surface of a substrate corresponding to a region in which said cavity is formed is elevated, in a moment when said cavity is formed within said substrate, said heat treatment allows the surface of the substrate to be returned to flatness at once, so that the surface of said substrate which is finally obtained is flat, and an interface between an upper portion of said cavity and said substrate is parallel and flat to a flat surface of said substrate.

54. The method of manufacturing a semiconductor substrate according to claim 53, wherein in said giving heat treatment, a process of discharging said implanted ions outside of said substrate as gas comprises low-temperature heat treatment carried out in a low-temperature region of not less than 400° C. through less than 700° C., before said high-temperature heat treatment.

55. The method of manufacturing a semiconductor substrate according to claim 53, wherein said giving heat treatment further includes middle-temperature heat treatment carried out in a middle-temperature region of not less than 700° C. through less than 1000° C. in order to allow growth of said plurality of respective micro-cavities, before said high-temperature heat treatment.

56. The method of manufacturing a semiconductor substrate according to claim 53, wherein said giving heat treatment further includes low-temperature heat treatment carried out in a low-temperature region of not less than 400° C. through less than 700° C. in order to discharge said implanted ions outside of said substrate as gas, and middle-temperature heat treatment carried out in a middle-temperature region of not less than 700° C. through less than 1000° C. in order to allow growth of said plurality of respective micro-cavities, before said high-temperature heat treatment.

57. The method of manufacturing a semiconductor substrate according to claim 56, wherein said low-temperature heat treatment is carried out at not less than 400° C. through less than 600° C., said middle-temperature heat treatment is carried out at not less than 800° C. through less than 1000° C., and said high-temperature heat treatment is carried out at a temperature increased further from 1200° C.

58. The method of manufacturing a semiconductor substrate according to claim 52, further comprising removing a surface oxide film formed on a surface of said substrate by said high-temperature heat treatment carried out in said oxygen rich atmosphere, after said high-temperature heat treatment.

59. A method of manufacturing a semiconductor device, comprising:
   selectively implanting ions into a predetermined region in a substrate, the implanted ions, in turn, forming a plurality of micro-cavities in said predetermined region;
   giving heat treatment to said substrate, thereby, after discharge of said implanted ions outside of said substrate as gas, allowing growth of said plurality of respective micro-cavities and further combination of adjacent micro-cavities with each other to form an embedded insulating region comprising a combined cavity present all over said predetermined region, and coating of a portion of an inside surface of said cavity within said embedded insulating region with a film; and
   forming at least one semiconductor device element in a surface region of the substrate on said embedded insulating region.

60. The method of manufacturing a semiconductor device according to claim 59, wherein said combined cavity includes a seamlessly uninterrupted inside surface, and includes an inner space completely closed from outside of said substrate by the inside surface.

61. The method of manufacturing a semiconductor device according to claim 59, wherein heat treatment in said giving heat treatment allows said substrate to soften due to inclusion of high-temperature heat treatment carried out in a high temperature range of not less than 1000° C., and even if a surface of a substrate corresponding to a region in which said cavity is formed is elevated, in a moment when said cavity is formed within said substrate, allows the surface of the substrate to return to flatness at once, so that the surface of said substrate which is finally obtained is flat, and an interface between an upper portion of said cavity and said substrate is parallel and flat to a flat surface of said substrate, and wherein in said forming, said at least one semiconductor device element is formed on said flat substrate surface.

62. The method of manufacturing a semiconductor device according to claim 59, wherein said film comprises an oxide film at least coating an inside surface which completely closes said inner space of said cavity is formed by carrying out at least said high-temperature heat treatment in oxygen rich atmosphere.

63. The method of manufacturing a semiconductor device according to claim 62, wherein said oxide film includes a thicker film thickness in a portion, which is formed on side walls of said cavity than in a portion, which is formed on inside upper and lower surfaces of said cavity.

64. The method of manufacturing a semiconductor device according to claim 63, wherein said oxide film coats an inside surface of said cavity, and includes at least one columnar portion which is formed in inner space of said cavity.

65. The method of manufacturing a semiconductor device according to claim 63, wherein said oxide film coats an inside surface of said cavity, and includes at least one barrier-structure portion which is formed in inner space of said cavity.

66. The method of manufacturing a semiconductor device according to claim 62, wherein said high-temperature heat treatment is carried out in said oxygen rich atmosphere until said oxide film fills up inner space of said cavity.

67. The method of manufacturing a semiconductor device according to claim 62, wherein said giving heat treatment further includes a process of removing a surface oxide film formed on a surface of said substrate by carrying out said high-temperature heat treatment in said oxygen rich atmosphere, after said high-temperature heat treatment, and wherein in said forming, said at least one semiconductor device element is formed on a surface of said substrate after removal of the surface oxide film.

68. The method of manufacturing a semiconductor device according to claim 59, wherein in said selectively implanting, at least one gate electrode structure is formed on said substrate, said at least one gate electrode being used as a mask to selectively implant said ions into said substrate, wherein in said giving heat treatment said cavity self-aligning to said at least one gate electrode structure is formed, and wherein in said forming, a source region and a drain region are formed in said substrate.

69. The method of manufacturing a semiconductor device according to claim 59, wherein in said selectively implanting, at least one isolation region is formed on an upper portion region of said substrate, said at least one isolation region being used as a mask to selectively implant said ions into said substrate, wherein in said giving heat treatment, said cavity self-aligning to said at least one isolation region is formed, and wherein in said forming, said at least one semiconductor device element is formed in a surface region of the substrate above said cavity.

70. The method of manufacturing a semiconductor device according to claim 59, wherein said predetermined region extends over a single semiconductor device element forming region of said substrate, whereby an embedded insulating region comprising said cavity extends over said semiconductor device element forming region.

71. The method of manufacturing a semiconductor device according to claim 59, wherein said predetermined region extends over a single circuit block forming region of said substrate, whereby an embedded insulating region comprising said cavity extends over said circuit block forming region.

72. The method of manufacturing a semiconductor device according to claim 59, wherein said semiconductor substrate is a silicon substrate.

73. The method of manufacturing a semiconductor device according to claim 59, further comprising a process of forming at least one single crystal semiconductor layer on said substrate surface after said giving heat treatment, wherein in said forming, said at least one semiconductor device element is formed on said at least one single crystal semiconductor layer.

74. A semiconductor substrate comprising an embedded insulating region comprising a combined, flat-shaped cavity present all over a predetermined region in the semiconductor substrate, wherein said cavity includes a seamlessly uninterrupted inside surface, and includes an inner space completely closed from outside of said substrate by the inside surface, wherein said inside surface is coated with at least an oxide film, said oxide film including a thicker film thickness in a portion, which is formed on side walls of said cavity than in a portion, which is formed on inside upper and lower surfaces of said cavity.

75. The semiconductor substrate according to claim 74, wherein a surface of said substrate is flat, and an interface between an upper portion of said cavity and said substrate is flat and parallel to a flat surface of said substrate.

76. The semiconductor substrate according to claim 74, wherein said oxide film coats said inside surface of said cavity, and includes at least one columnar portion extending in inner space of said cavity.

77. The semiconductor substrate according to claim 74, wherein said oxide film coats said inside surface of said cavity, and includes at least one barrier-structure portion extending in inner space of said cavity.

78. The semiconductor substrate according to claim 74, wherein said cavity self-aligns to at least one electrode present on said substrate.

79. The semiconductor substrate according to claim 74, wherein said cavity self-aligns to at least one isolation region present on said substrate.

80. The semiconductor substrate according to claim 74, wherein said predetermined region extends over a single semiconductor device element forming region of said substrate, whereby an embedded insulating region comprising said cavity extends over said semiconductor device element forming region.

81. The semiconductor substrate according to claim 74, wherein said predetermined region extends over a single circuit block forming region of said substrate, whereby an embedded insulating region comprising said cavity extends over said circuit block forming region.

82. The semiconductor substrate according to claim 74, wherein said semiconductor substrate comprises a silicon substrate.

83. A semiconductor substrate comprising an embedded insulating region comprising a combined, flat-shaped cavity present all over a predetermined region in the semiconductor substrate,
wherein said cavity includes a seamlessly uninterrupted inside surface, and includes an inner space completely closed from outside of said substrate by the inside surface, and an inside part of said cavity includes no ion-implanted ions into said substrate in order to form said cavity, said inside surface being coated with at least an oxide film, said oxide film including a film thickness in a portion which is formed on side walls of said cavity which is greater than a film thickness in a portion which is formed on inside upper and lower surfaces of said cavity, and
wherein a surface of said substrate is flat, and an interface between an upper portion of said cavity and said substrate is parallel and flat to a flat surface of said substrate.

84. The semiconductor substrate according to claim 83, wherein said cavity self-aligns to at least one electrode present on said substrate.

85. The semiconductor substrate according to claim 83, wherein said cavity self-aligns to at least one isolation region present on said substrate.

86. The semiconductor substrate according to claim 83, wherein said predetermined region extends over a single semiconductor device element forming region of said substrate, whereby an embedded insulating region comprising said cavity extends over said semiconductor device element forming region.

87. The semiconductor substrate according to claim 83, wherein said predetermined region extends over a single circuit block forming region of said substrate, whereby an embedded insulating region comprising said cavity extends over said circuit block forming region.

88. The semiconductor substrate according to claim 83, wherein said semiconductor substrate comprises a silicon substrate.

89. A semiconductor device comprising:
a semiconductor substrate comprising an embedded insulating region comprising a combined, flat-shaped cavity present all over a predetermined region in said semiconductor substrate,
wherein said cavity includes a seamlessly uninterrupted inside surface, and includes an inner space completely closed from outside of said substrate by the inside surface, wherein said inside surface is coated with at least an oxide film, said oxide film having a thicker film thickness in a portion, which is formed on side walls of said cavity than in a portion, which is formed on inside upper and lower surfaces of said cavity; and
at least one semiconductor device element which is present in a surface region of the semiconductor substrate on said embedded insulating region.

90. The semiconductor device according to claim 89, wherein a surface of said substrate is flat, and an interface between an upper portion of said cavity and said substrate is flat and parallel to a flat surface of said substrate.

91. The semiconductor device according to claim 89, wherein said oxide film coats said inside surface of said cavity, and includes at least one columnar portion extending in inner space of said cavity.

92. The semiconductor device according to claim 89, wherein said oxide film coats said inside surface of said cavity, and includes at least one barrier-structure portion extending in inner space of said cavity.

93. The semiconductor device according to claim 89, wherein said cavity self-aligns to at least one electrode present on said substrate.

94. The semiconductor device according to claim 89, wherein said cavity self-aligns to at least one isolation region present on said substrate.

95. The semiconductor device according to claim 89, wherein said predetermined region extends over a single semiconductor device element forming region of said substrate, whereby an embedded insulating region comprising said cavity extends over said semiconductor device element forming region.

96. The semiconductor device according to claim 89, wherein said predetermined region extends over a single circuit block forming region of said substrate, whereby an embedded insulating region comprising said cavity extends over said circuit block forming region.

97. The semiconductor device according to claim 89, wherein said semiconductor substrate comprises a silicon substrate.

98. A semiconductor device comprising:
a semiconductor substrate comprising an embedded insulating region comprising a combined, flat-shaped cavity present all over a predetermined region in said semiconductor substrate,
wherein said cavity includes a seamlessly uninterrupted inside surface, and includes an inner space completely closed from outside of said substrate by the inside surface, said inside surface being coated with at least an oxide film, said oxide film including a film thickness in a portion which is formed on side walls of said cavity that is greater than a film thickness in a portion which is formed on inside upper and lower surfaces of said cavity, and an inside part of said cavity includes no ion-implanted ions into said substrate in order to form said cavity, and wherein a surface of said substrate is flat, and an interface between an upper portion of said cavity and said substrate is flat and parallel to a flat surface of said substrate; and
at least one semiconductor device element which is present on a surface region of the semiconductor substrate on said embedded insulating region.

99. The semiconductor device according to claim 98, wherein said cavity self-aligns to at least one electrode present on said substrate.

100. The semiconductor device according to claim 98, wherein said cavity self-aligns to at least one isolation region present on said substrate.

101. The semiconductor device according to claim 98, wherein said predetermined region extends over a single semiconductor device element forming region of said substrate, whereby an embedded insulating region comprising said cavity extends over said semiconductor device element forming region.

102. The semiconductor device according to claim 98, wherein said predetermined region extends over a single circuit block forming region of said substrate, whereby an embedded insulating region comprising said cavity extends over said circuit block forming region.

103. The semiconductor device according to claim 98, wherein said semiconductor substrate comprises a silicon substrate.

* * * * *